(12) United States Patent
Aikoh et al.

(10) Patent No.: US 8,208,359 B2
(45) Date of Patent: Jun. 26, 2012

(54) OPTICAL HEAD, OPTICAL INFORMATION RECORDING AND REPRODUCING DEVICE, AND OPTICAL INFORMATION SYSTEM DEVICE

(75) Inventors: Hideki Aikoh, Osaka (JP); Makoto Takashima, Nara (JP); Eishin Mori, Kyoto (JP); Kousei Sano, Osaka (JP); Joji Anzai, Osaka (JP); Kenichi Shinotani, Osaka (JP)

(73) Assignee: Panasonic Corporation, Osaka (JP)

( * ) Notice: Subject to any disclaimer, the term of this patent is extended or adjusted under 35 U.S.C. 154(b) by 470 days.

(21) Appl. No.: 12/517,676

(22) PCT Filed: Dec. 4, 2007

(86) PCT No.: PCT/JP2007/073385
§ 371 (c)(1),
(2), (4) Date: Jun. 4, 2009

(87) PCT Pub. No.: WO2008/069193
PCT Pub. Date: Jun. 12, 2008

(65) Prior Publication Data
US 2009/0268588 A1    Oct. 29, 2009

(30) Foreign Application Priority Data
Dec. 4, 2006 (JP) ................................. 2006-327406

(51) Int. Cl.
*G02B 1/00* (2006.01)
*G11B 7/135* (2012.01)

(52) U.S. Cl. ............. 369/112.23; 369/44.11; 369/44.14; 369/112.01; 369/112.05; 525/477; 528/25; 528/31; 528/32

(58) Field of Classification Search .................. None
See application file for complete search history.

(56) References Cited

U.S. PATENT DOCUMENTS

| 7,345,125 | B2 | 3/2008 | Isozaki et al. | |
|---|---|---|---|---|
| 7,623,434 | B2 * | 11/2009 | Kimura et al. | 369/112.08 |
| 2006/0002277 | A1 * | 1/2006 | Watabe et al. | 369/112.01 |
| 2006/0069216 | A1 | 3/2006 | Isozaki et al. | |
| 2006/0122351 | A1 | 6/2006 | Laine et al. | |
| 2008/0080357 | A1 * | 4/2008 | Tanaka et al. | 369/112.23 |
| 2008/0304393 | A1 * | 12/2008 | Shibuya et al. | 369/112.01 |
| 2009/0189127 | A1 * | 7/2009 | Nakamura et al. | 252/582 |
| 2009/0225640 | A1 * | 9/2009 | Manabe et al. | 369/100 |

FOREIGN PATENT DOCUMENTS

| JP | 1-287830 | 11/1989 |
|---|---|---|
| JP | 7-73503 | 3/1995 |
| JP | 2004-359933 | 12/2004 |
| JP | 2006040351 | * 2/2006 |
| JP | 2006-89685 | 4/2006 |
| JP | 2006-299150 | 11/2006 |
| JP | 2006-324596 | 11/2006 |
| JP | 2007-31619 | 2/2007 |
| WO | 2006/118084 | 11/2006 |
| WO | WO 2008/065862 A1 * | 6/2008 |

OTHER PUBLICATIONS

Machine translation of JP 2006-299150 (Feb. 2006).*
Abstract for JP 2006-040351 (Feb. 2006).*
International Search Report issued Jan. 15, 2008 in the International (PCT) Application No. PCT/JP2007/073385.
Edward G. Shockey et al., "Functionalized Polyhedral Oligosilsesquioxane (POSS) Macromers: New Graftable POSS Hydride, POSS α-Olefin, POSS Epoxy, and POSS Chlorosilane Macromers and POSS-Siloxane Triblocks", Applied Organometallic Chemistry, 13, pp. 311-327 (1999).
Joseph J. Schwab et al., "Polyhedral Oligomeric Silsesquioxane (POSS)-Based Polymers", Applied Organometallic Chemistry, 12, pp. 707-713 (1998).
Dagobert Hoebbel et al., "Inorganic-organic polymers derived from functional silicic acid derivatives by additive reaction", Journal of Non-Crystalline Solids, 176, pp. 179-188, (1994).

* cited by examiner

*Primary Examiner* — Marc Zimmer
(74) *Attorney, Agent, or Firm* — Wenderoth, Lind & Ponack, L.L.P.

(57) ABSTRACT

An object of the invention is to provide an optical element for use in an optical information recording and reproducing device or a like device for recording or reproducing information with respect to an information recording medium using laser light, wherein the optical element is a resin optical element capable of suppressing lowering in transmittance due to deterioration by irradiation of light having a high energy density, and maintaining a high transmittance for a long time. To realize the above object, used is an optical element made of a silicon resin cured material obtained by subjecting a silicon resin composition containing a silsesquioxane compound to a curing treatment.

10 Claims, 26 Drawing Sheets

41
42

175

0.5nm 0.5nm

AFTER 0 HOUR    AFTER 67 HOURS

OPTICAL HEAD, OPTICAL INFORMATION RECORDING AND REPRODUCING DEVICE, AND OPTICAL INFORMATION SYSTEM DEVICE

TECHNICAL FIELD

The present invention relates to an optical head for use in an optical information recording and reproducing device for optically recording and reproducing information with respect to an optical disc as an information recording medium, an optical information recording and reproducing device incorporated with the optical head, and an optical information system incorporated with the optical information recording and reproducing device.

BACKGROUND ART

In recent years, as the recording information amount has been increasing in the information technology field, large capacity optical discs have been demanded. The capacity of an optical disc i.e. the density of recording information can be increased by increasing the numerical aperture (NA) of an objective lens, and using short wavelength laser light to be emitted from a light source.

A light source for emitting light of 660 nm wavelength and an objective lens of 0.6 in NA are used for currently available and widely used digital versatile discs (DVD).

On the other hand, the density of recording information as next-generation optical discs is increased by using a blue laser for emitting light of 405 nm wavelength for blue ray discs (BD) and HD-DVD and setting NA to 0.85 in BD, and 0.65 in HD-DVD. High-performance, miniaturization, and cost reduction are required for an optical head to be used in an optical information recording and reproducing device for optically recording or reproducing information with respect to an optical disc using the blue laser.

FIG. 32 is a conceptual diagram showing an arrangement of an optical head 76 for use in a conventional and general optical information recording and reproducing device. Referring to FIG. 32, the reference numeral 7' indicates an optical disc, 71 indicates a semiconductor laser for emitting laser light of 660 nm wavelength, 72 indicates an objective lens for condensing light to be emitted from the semiconductor laser 71 into a small light spot to be incident onto the optical disc 7', 73 indicates an objective lens actuator, as condensing element driving means, for driving the objective lens 72 to correct plane displacement or axial displacement of the optical disc 7', 74 indicates a half mirror made of a glass material and for splitting reflection light from the optical disc 7', 75 indicates a light receiving element for receiving reflection light from the optical disc 7', and 78 indicates a detection lens made of a glass material and for condensing reflection light from the optical disc 7' onto the light receiving element 75.

The optical head 76 is constituted of the semiconductor laser 71, the objective lens 72, the objective lens actuator 73, the half mirror 74, the detection lens 78, and the light receiving element 75. The light receiving element 75 functions as an RF signal light receiving element for detecting an information signal from the optical disc 7', and a servo signal light receiving element for detecting a servo signal from the optical disc 7'.

In the conventional optical head 76, for instance, a multi-divided light receiving element is used as a light receiving element for detecting an RF signal and a servo signal. A light receiving element to be used in a conventional and general optical head is described referring to the diagrams shown in FIGS. 33A and 33B.

FIG. 33A is a plan view of a 2-divided photodiode 80 to be used as a light receiving element, and FIG. 33B is a cross-sectional view taken along the line D-D' in FIG. 33A.

Referring to FIGS. 33A and 33B, the reference numeral 80 indicates a 2-divided photodiode. 21a and 21b each indicates a light receiving cell made of a semiconductor material and having a size of e.g. 0.75 mm×0.75 mm in area and 0.3 mm in thickness. 28 indicates a dividing line for separating the light receiving cell 21a and the light receiving cell 21b. 22a and 22b indicate upper electrodes to be formed on the surfaces of the light receiving cells 21a and 21b, respectively. 23a, 23b, 23c, and 23d each indicates a frame terminal. 25 indicates a lower electrode continuously formed on the backside surfaces of the light receiving cells 21a and 21b. 26a indicates a metal wire for electrically connecting the upper electrode 22a and the frame terminal 23a. 26b indicates a metal wire for electrically connecting the upper electrode 22b and the frame terminal 23b. 87 indicates a resin protector which is made of a cured transparent epoxy resin, is adapted for protecting the 2-divided photodiode 80, with a size of e.g. 4 mm×5 mm in area and 1.9 mm in thickness, and is adapted for defining the outer shape of the 2-divided photodiode 80. The frame terminal 23c and the frame terminal 23d are integrally formed into a frame member 24.

The lower electrode 25 formed on the backside surfaces of the light receiving cells 21a and 21b is electrically connected to the frame member 24. The upper electrodes 22a and 22b are electrically connected to the frame terminals 23a and 23b by the metal wires 26a and 26b, respectively. In the 2-divided photodiode 80, the frame terminal 23a, 23b is an anode terminal, and the frame terminal 23c, 23d is a cathode terminal. Light received on each of the light receiving cells 21a and 21b is converted into a photocurrent. The photocurrent is outputted from the frame terminal 23a, 23b. A portion constituted of the light receiving cells 21a and 21b, and the upper electrodes 22a and 22b is also called as a light receiving chip 29.

The 2-divided photodiode 80 to be used as a light receiving element in a conventional and general optical head has the following problem.

Generally, an epoxy resin is used as a material of a resin protector for protecting a 2-divided photodiode to be used in an optical head in an optical information recording and reproducing device for an optical disc such as DVD, using laser light of 660 nm wavelength. However, in the case where an epoxy resin is used as a material of a resin protector for protecting a 2-divided photodiode in an optical information recording and reproducing device for next-generation discs such as BD or HD-DVD, using a blue laser for emitting light of 405 nm wavelength or a like device, the epoxy resin may be oxidized by UV absorption in receiving blue laser light of 405 nm wavelength. As a result, the color of the resin protector may be changed by formation of colored substance, and the light transmittance of the resin protector may be gradually reduced. As the light transmittance of the resin protector is reduced, the light receiving amount on the light receiving cells 21a and 21b may be reduced. As a result, detection of light indicating an RF signal or a servo signal may be insufficient.

In order to solve the above problem, for instance, patent document 1 discloses a 2-divided photodiode 162 having an arrangement as shown in FIGS. 34A and 34B, wherein a glass plate is fixedly disposed on an optical path of light in a light receiving element to block light transmittance through an epoxy resin. FIG. 34A is a plan view of the 2-divided photodiode 162, and FIG. 34B is a cross-sectional view taken along the line E-E' in FIG. 34A.

Referring to FIGS. 34A and 34B, the reference numeral 161 indicates a glass plate, 87 indicates a resin protector, 21a and 21b each indicates a light receiving cell, 28 indicates a dividing line, 22a and 22b each indicates an upper electrode, 23a, 23b, 23c, and 23d each indicates a frame terminal, 25 indicates a lower electrode, 26a and 26b each indicates a metal wire, 160 indicates a light receiving chip constituted of the light receiving cells 21a and 21b, and the upper electrodes 22a and 22b. The frame terminal 23c and the frame terminal 23d are integrally formed into a frame member 24.

The 2-divided photodiode 162 is different from the 2-divided photodiode 80 in the point that the glass plate 161 disposed on the optical path of light in the light receiving element is fixed to the resin protector 87 made of an epoxy resin and having an outer shape with a hollow portion and a step portion.

The 2-divided photodiode 162 has a size of e.g. 5 mm×6 mm in area, and 1.9 mm in thickness.

In the 2-divided photodiode 162, solely semiconductor laser light of 405 nm wavelength is transmitted through the glass plate 161, and reaches on the light receiving cells 21a and 21b, without transmitting through the resin protector 87 made of an epoxy resin. Accordingly, in the 2-divided photodiode 162, there is no likelihood that the light receiving amount of the light receiving chip 160 may be reduced resulting from a reduced light transmittance.

However, the 2-divided photodiode 162 has a problem that the production process may be complicated due to an increased number of production steps by an increased number of parts, or the outer dimensions of the 2-divided photodiode 162 may be increased.

A detection lens, an objective lens, or a like element to be used in a conventional and general optical head is made of a glass material, as recited in e.g. patent document 2. A detection lens made of a glass material is free from a problem that the transmittance may be lowered. However, in the case where a detection lens, an objective lens, or a like element is made of a glass material, the production process may be complicated. Also, there is a demand for a lens made of a transparent resin, which is easily fabricated by injection molding, to reduce the size of a detection lens for miniaturization of an optical head, and to product an axially asymmetrical lens.

Patent document 1: JP No. Hei 7-73503-A
Patent document 2: JP No. Hei 1-287830-A

SUMMARY OF THE INVENTION

In view of the above, it is an object of the invention to provide an optical head incorporated with a resin optical element to be used in an optical information recording and reproducing device for recording or reproducing information with respect to an information recording medium such as an optical disc using laser light, specifically, an optical head including an optical element capable of suppressing lowering in transmittance by suppressing light-deterioration of a material of the optical element through which light having a high energy density is transmitted, and maintaining a high transmittance for a long time.

An aspect of the invention is directed to an optical head for use in an optical information recording and reproducing device for recording or reproducing information with respect to an information recording medium using laser light, wherein the optical head includes an optical element made of a silicon resin cured material obtained by subjecting a silicon resin composition containing a silsesquioxane compound to a curing treatment.

These and other objects, features and advantages of the present invention will become more apparent upon reading of the following detailed description along with the accompanying drawings.

BEST MODE FOR CARRYING OUT THE INVENTION (First Embodiment)

Figure 1:
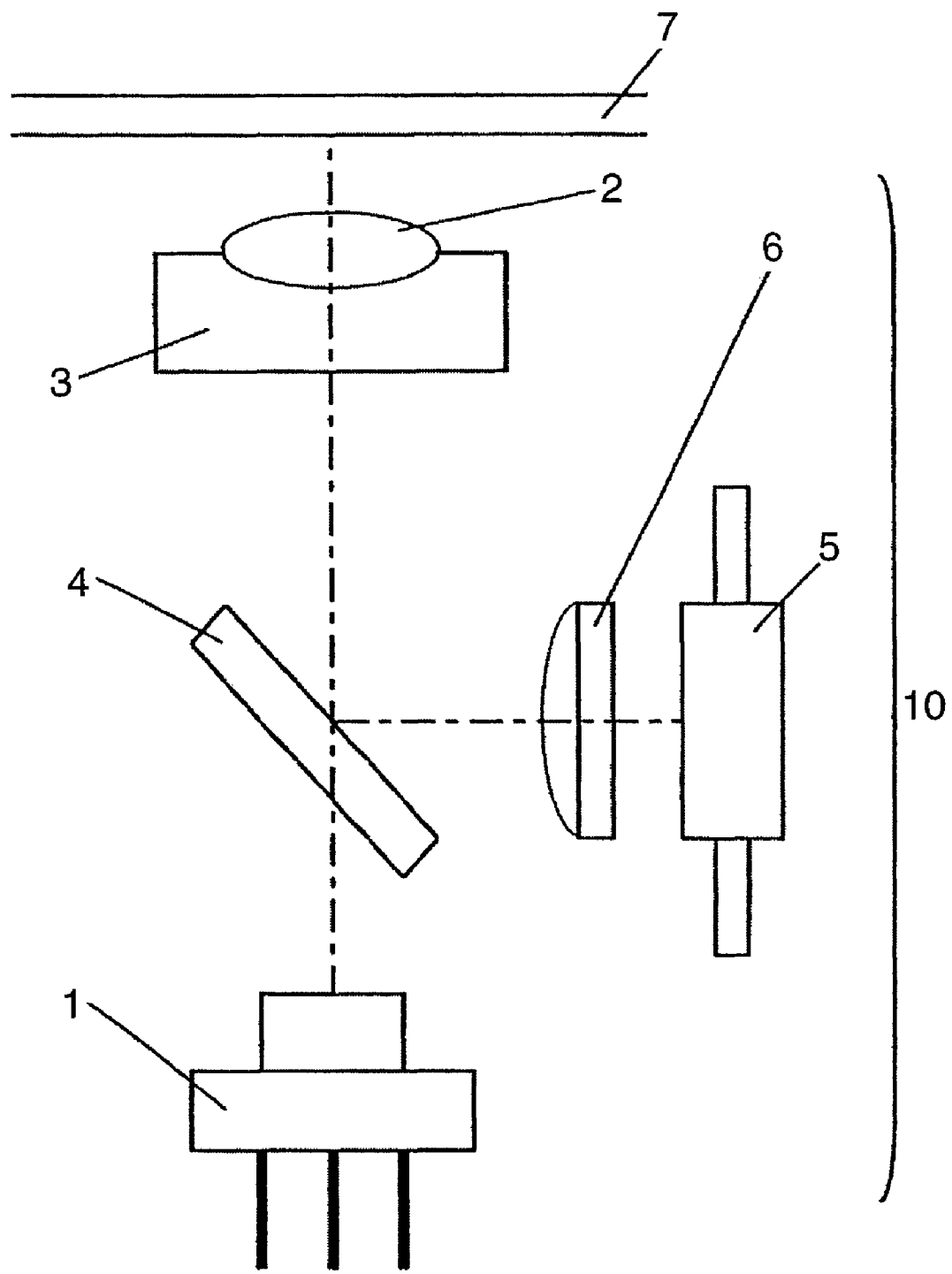
FIG. 1 is a diagram showing an arrangement of an optical head in accordance with a first embodiment of the invention.

An optical head in accordance with the first embodiment of the invention is described referring to FIG. 1.

FIG. 1 is a diagram showing an arrangement of an optical head 10 in accordance with the first embodiment. Referring to FIG. 1, the reference numeral 7 indicates an optical disc as an information recording medium, 1 indicates a semiconductor laser light source for emitting laser light of 405 nm wavelength, 2 indicates an objective lens as a condensing element, 3 indicates an objective lens actuator as condensing element driving means, 4 indicates a half mirror made of a glass material, 5 indicates a light receiving element including a 2-divided photodiode, and 6 indicates a detection lens for condensing reflection light from the optical disc 7.

Figure 2A:
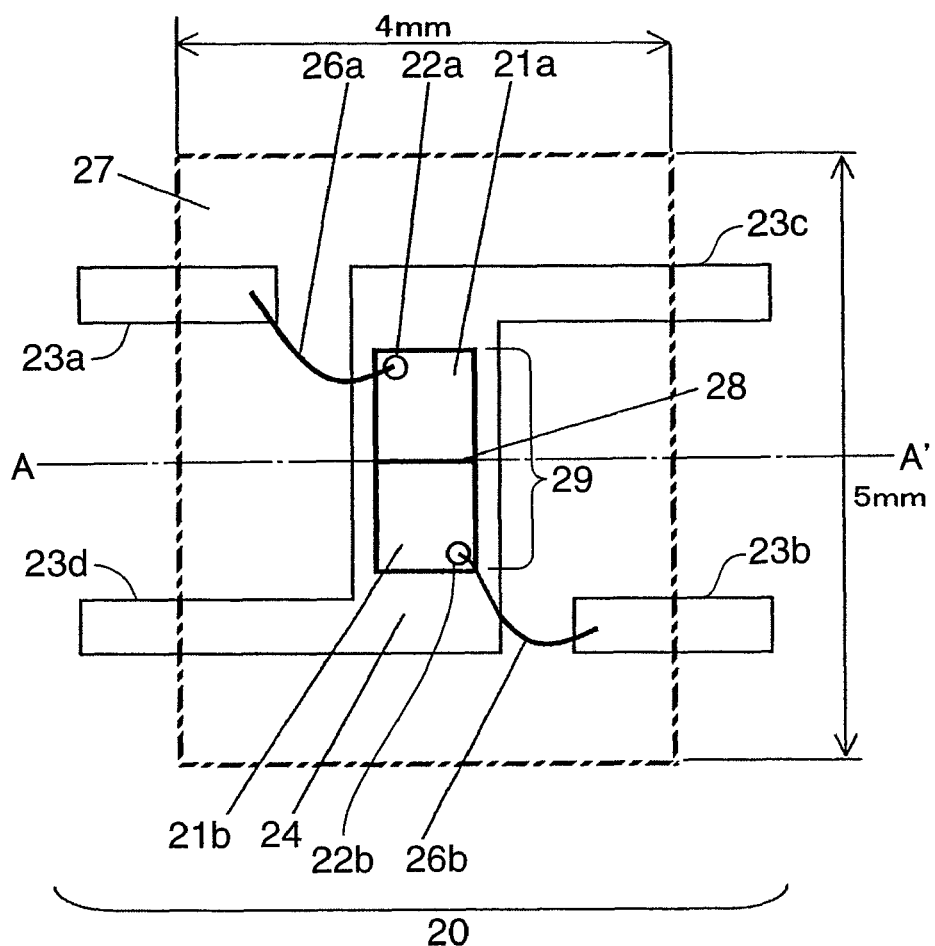
FIG. 2A is a plan view of a light receiving element (2-divided photodiode) to be used in the optical head in accordance with the first embodiment.
Figure 2B:
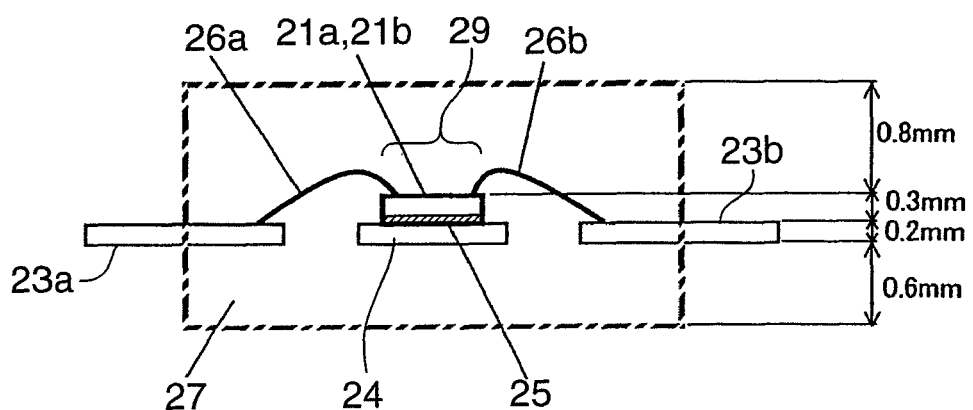
FIG. 2B is a cross-sectional view taken alone the line A-A' in FIG. 2A.

FIG. 2A is a plan view of a 2-divided photodiode 20 as a part of the light receiving element 5. FIG. 2B is a cross-sectional view taken along the line A-A' in FIG. 2A. Referring to FIGS. 2A and 2B, the reference numerals 21a and 21b each indicates a light receiving cell made of a semiconductor material and having a size of e.g. 0.75 mm×0.75 mm in area and 0.3 mm in thickness. 22a and 22b indicate upper electrodes to be formed on the surfaces of the light receiving cells 21a and 21b, respectively. 23a, 23b, 23c, and 23d each indicates a frame terminal. 25 indicates a lower electrode continuously formed on the backside surfaces of the light receiving cells 21a and 21b. 26a indicates a metal wire for electrically connecting the upper electrode 22a and the frame terminal 23a. 26b indicates a metal wire for electrically connecting the upper electrode 22b and the frame terminal 23b. 27 indicates a resin protector which is adapted for protecting the 2-divided photodiode 20, with a size of e.g. 4 mm×5 mm in area and 1.8 mm in thickness, and is adapted for defining the outer shape of the 2-divided photodiode 20. 28 indicates a dividing line for separating the light receiving cell 21*a* and the light receiving cell 21*b*. The frame terminal 23*c* and the frame terminal 23*d* are integrally formed into a frame member 24.

The lower electrode 25 formed on the backside surfaces of the light receiving cells 21*a* and 21*b* is electrically connected to the flame member 24. The upper electrodes 22*a* and 22*b* are electrically connected to the frame terminal 23*a* and 23*b* by the metal wires 26*a* and 26*b*, respectively. In the 2-divided photodiode 20, the frame terminal 23*a*, 23*b* is an anode terminal, and the frame terminal 23*c*, 23*d* is a cathode terminal. Light received on each of the light receiving cells 21*a* and 21*b* is converted into a photocurrent. The photocurrent is outputted from the frame terminal 23*a*, 23*b*. A portion constituted of the light receiving cells 21*a* and 21*b*, and the upper electrodes 22*a* and 22*b* is also called as a light receiving chip 29.

As the first embodiment, there is described in detail an optical head incorporated with the resin protector 27 for protecting the 2-divided photodiode 20 used as the light receiving element 5, serving as an optical element, wherein the optical element is made of a cured silicon resin obtained by subjecting a silicon resin composition containing a caged-silsesquioxane compound to a curing treatment.

Examples of the caged-silsesquioxane compound are silsesquioxane compounds as expressed by the general formulas (1) through (3), and partially polymerized products of silsesquioxane compounds obtained by partial addition reaction of the silsesquioxane compounds. A cured material of the aforementioned caged-silsesquioxane compound has excellent resistance to irradiation of light having a high energy density.

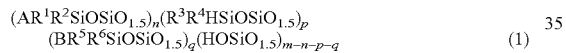

$$(AR^1R^2SiOSiO_{1.5})_n(R^3R^4HSiOSiO_{1.5})_p (BR^5R^6SiOSiO_{1.5})_q(HOSiO_{1.5})_{m-n-p-q} \quad (1)$$

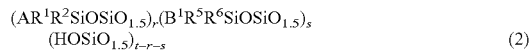

$$(AR^1R^2SiOSiO_{1.5})_r(B^1R^5R^6SiOSiO_{1.5})_s (HOSiO_{1.5})_{t-r-s} \quad (2)$$

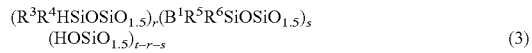

$$(R^3R^4HSiOSiO_{1.5})_r(B^1R^5R^6SiOSiO_{1.5})_s (HOSiO_{1.5})_{t-r-s} \quad (3)$$

where, in the formulas (1) through (3), A is a group having a carbon-carbon unsaturated bond, B is a substituted or non-substituted saturated alkyl group or hydroxyl group, $B^1$ is a substituted or non-substituted saturated alkyl group or hyodroxyl group, or a hydrogen atom, $R^1$ to $R^6$ are each individually a functional group selected from a lower alkyl group, a phenyl group, and a lower arylalkyl group, m and t are each a number selected from 6, 8, 10, and 12, m is an integer from 1 to (m−1), p is an integer from 1 to (m−n), q is an integer from 0 to (m−n−p), r is an integer from 2 to t, and s is an integer from 0 to (t−r).

A particularly preferred example of the group having a carbon-carbon unsaturated bond represented by A in the general formula (1) or the general formula (2) is a chain hydrocarbon group having a carbon-carbon unsaturated bond at an end.

An example of the silsesquioxane compound expressed by the formula (1) is tetrakis(cyclohexenenylethyldimethylsiloxy)-tetrakis(dimethyl-siloxy)silsesquioxane (TCHS), where m=8, n=4, p=4, $R^1$, $R^2$, $R^3$, $R^4$ are each a methyl group, and A is a cyclohexene group.

The structure of TCHS is shown by the formula (4).

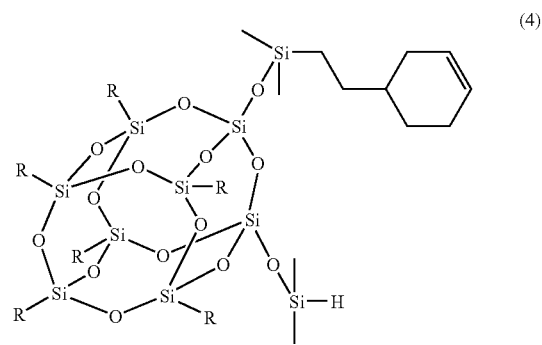

(4)

where, in the structural formula (4), R each is a cyclohexenenylethyldimethylsiloxane group (—O—Si(CH$_3$)$_2$—CH$_2$—C$_6$H$_8$) or a dimethylsiloxane group (—O—Si(CH$_3$)$_2$H), and four cyclohexenenylethyldimethylsiloxane groups and four dimethylsiloxane groups are contained in a molecule.

The molecule of TCHS has the following crosslinked structure by reaction of cyclohexenenylethyldimethylsiloxane groups and dimethylsiloxane groups.

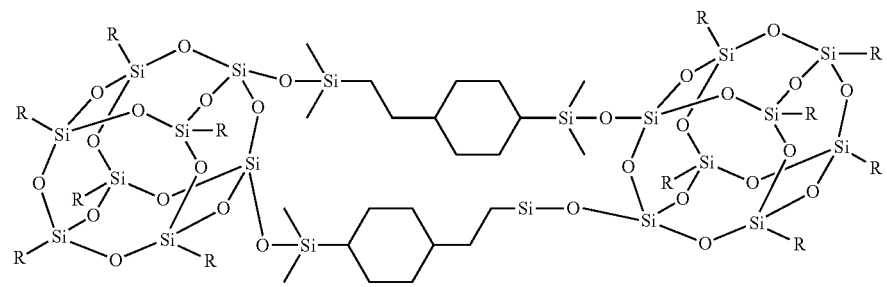

Examples of the silsesquioxane compound expressed by the general formula (2) are tetraallylsilsesquioxane, octavinylsilsesquioxane, tetraallyldimethylsiloxy-tetratrimethylsiloxysilsesquioxane, octavinyldimethylsiloxysilsesquioxane, and hexaallyldimethylsiloxy-dihydroxysilsesquioxane.

The structure of tetraallylsilsesquioxane is shown by the formula (5). Tetraallylsilsesquioxane is a compound expressed by the general formula (2), where t=8, r=4, s=4, $R^1$, $R^2$, $R^5$, and $R^6$ are each a methyl group, A is an allyl group, and $B^1$ is a hydrogen atom.

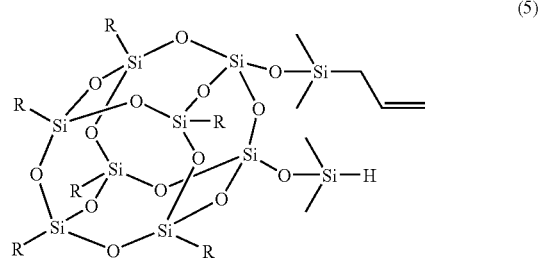

(5)

where, in the structural formula (5), R each is an allyldimethylsiloxane group (—O—Si(CH$_3$)$_2$—CH$_2$—CH=CH$_2$), or a dimethylsiloxane group (—O—Si(CH$_3$)$_2$H), and four allyldimethylsiloxane groups and four dimethylsiloxane groups are contained in a molecule.

The molecule of tetraallylsilsesquioxane has the following crosslinked structure by reaction of allyldimethylsiloxane groups and dimethylsiloxane groups.

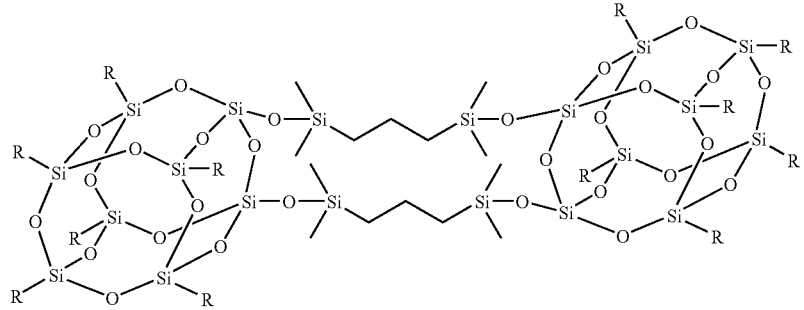

Examples of the silsesquioxane compound expressed by the general formula (3) are octahydridesilsesquioxane, and tetratrimethyl-tetrakisdimethylsiloxysilsesquioxane.

A cured material having a finer crosslinked structure is obtained by containing a crosslinking agent in the silicon resin composition. A cured material having a fine crosslinked structure has a higher stability against light having a high energy density. Accordingly, use of a crosslinking agent is advantageous in obtaining an optical element capable of further suppressing a material deterioration against repeated irradiation of blue laser light having a high energy density.

Examples of the crosslinking agent are the compounds expressed by the general formula (6) or the general formula (7).

$$HR^7R^8Si—X—SiHR^9R^{10} \qquad (6)$$

where, in the formula (6), X is a divalent linking group or a divalent atom, $R^7$, $R^8$, $R^9$, and $R^{10}$ are each individually an alkyl group having 1 to 3 carbons, or a hydrogen atom.

$$H_2C=CH—Y—CH=CH_2 \qquad (7)$$

where, in the formula (7), Y is a divalent linking group or a divalent atom.

Examples of the compound expressed by the general formula (6) are tetramethyldisiloxane, hexamethyltrisiloxane, octamethylpentasiloxane, di(dimethylsilyl)ethane, di(dimethylsilylphenyl)ether, and o-di(dimethylsilyl)benzene.

Examples of the compound expressed by the general formula (7) are divinyltetramethyldisiloxane, diallyltetramethyldisiloxane, divinyldiphenyldimethyldisiloxane, divinylhexamethyltrisiloxane, diallyldiphenylsilane, and diallyldisulfide.

A preferred mixing ratio of the crosslinking agent to the silsesquioxane compound is from about 0.01 to 3 equivalents with respect to 1 equivalent part of a functional group of the silsesquioxane compound.

In the following, the 2-divided photodiode 20 having the resin protector 27 made of a cured TCHS, as an optical element, is described as an example of the optical element made of a silicon resin cured material containing a caged-silsesquioxane compound.

Figure 3:
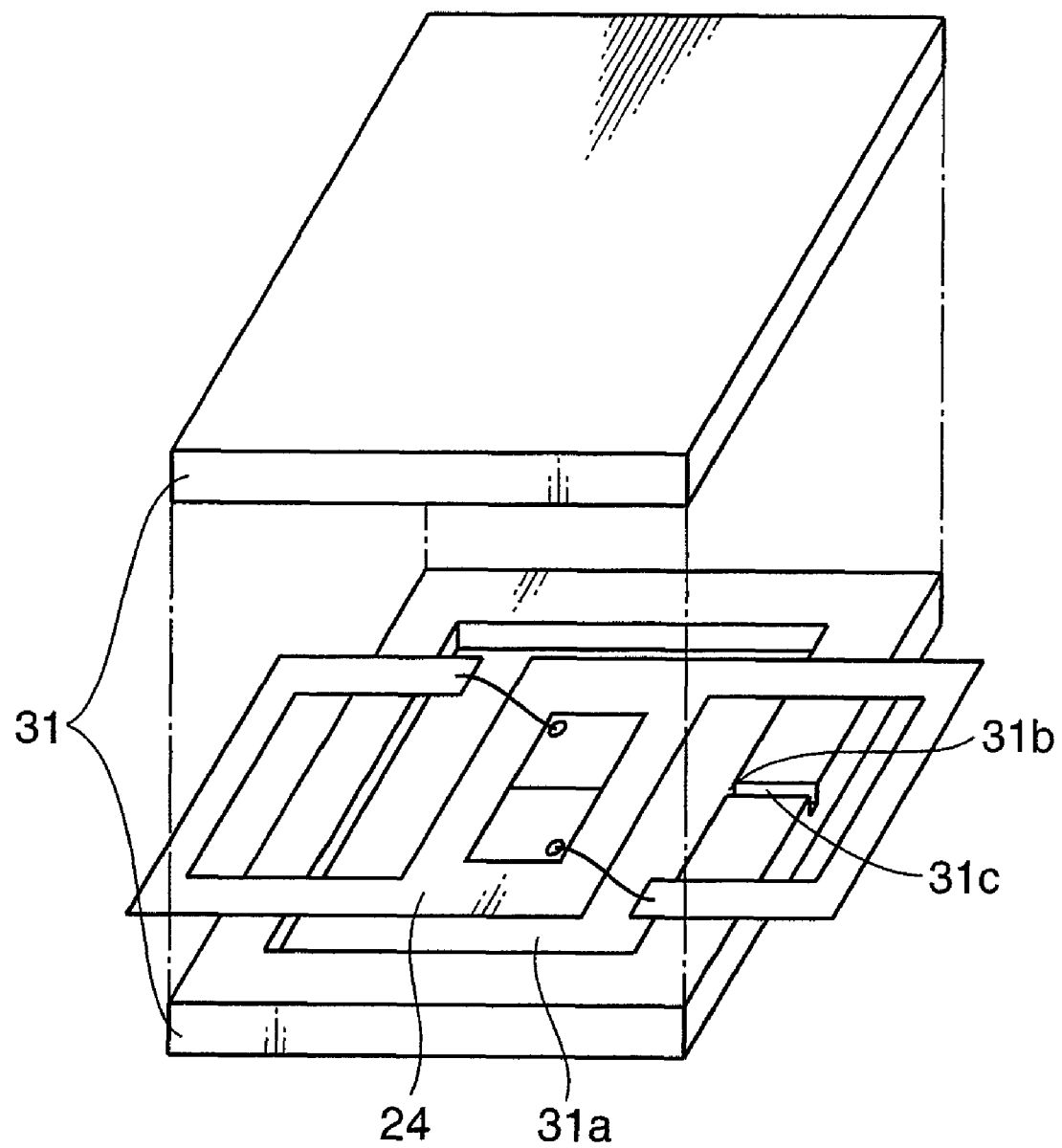
FIG. 3 is a diagram for describing a method for producing the light receiving element (2-divided photodiode).

First, a method for producing the 2-divided photodiode 20 is described referring to FIG. 3.

FIG. 3 is a diagram showing an arrangement of a metal die 31 made of a die steel and having a cavity portion 31a, a gate portion 31b, and a runner portion 31c, wherein the light receiving chip 29, and the frame member 24 connected to the metal wires 26a and 26b are disposed in the cavity portion 31a of a fixed-side die of the metal die 31. The metal die 31 is operated in such a manner that a movable-side die of the metal die 31 is moved to close the cavity portion 31a, with the frame member 24 being sandwiched. The gate portion 31b of the metal die 31 is formed in a joint surface of the cavity portion 31a corresponding to an outer perimeter of the resin protector 27 in such a manner that the gate portion 31b extends in a direction perpendicular to the frame terminal within the plane of the frame member 24. Preferably, the frame terminals 23a through 23d are integrally formed with the frame member 24. The modification facilitates positioning the frame member 24 with respect to the cavity portion 31a. After molding, the frame member 24 is cut into divided photodiodes. This enables to increase the number of mold products taken by one time operation, and enhance productivity.

Heat molding is performed by filling 1 g of TCHS obtained by synthesis and purification into the cavity portion 31a through the gate portion 31b. The outer shape of the 2-divided photodiode 20 is formed by filling the TCHS. The filled TCHS is subjected to a heat curing treatment by heat molding under reduced pressure for about 3 hours at a fixed temperature e.g. about 200° C. of the cavity portion 31a. Thereby, the resin protector 27 made of a silicon resin cured material having a shape substantially identical to the outer shape of the 2-divided photodiode 20 is formed. In heat molding, a pressure keeping is applied to the cavity portion 31a. Applying a pressure keeping enables to improve dimensional precision and plane precision of the resin protector 27. A pressure keeping may be applied stepwise.

While the above process is carried out, addition polymerization reaction progresses by reaction of a hydrogen atom bound to a silicon atom, and a group having a carbon-carbon unsaturated bond between adjacent molecules of TCHS. TCHS is cured by the addition polymerization reaction.

Figure 4A:
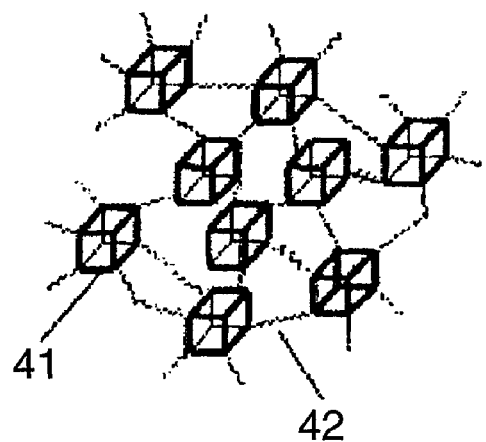
FIG. 4A is a diagram showing a 3-dimensional crosslinked structure, wherein caged-silsesquioxane is bonded by crosslinking.
Figure 4B:
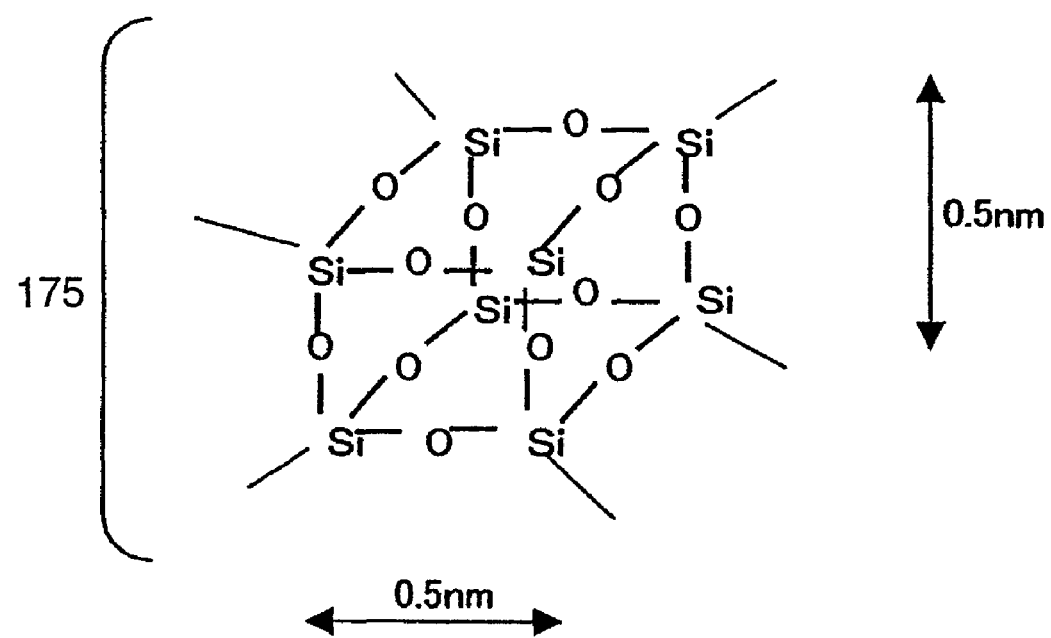
FIG. 4B is a diagram showing a structure of caged-silsesquioxane.

FIGS. 4A and 4B are diagrams showing a 3-dimensional crosslinked structure of a silicon resin cured material obtained by subjecting a caged-silsesquioxane compound such as TCHS to addition polymerization. FIG. 4A is a diagram showing a 3-dimensional crosslinked structure obtained by subjecting multiple caged-silsesquioxane compounds to crosslinking. FIG. 4B is a diagram showing a caged-silsesquioxane compound. Referring to FIG. 4A, the reference numeral 41 indicates a hexahedral structure constituted of silicon atoms and oxygen atoms, and 42 indicates an organic segment for binding the hexahedral structures 41 by crosslinking.

As shown in FIG. 4B, the caged-silsesquioxane has a polyhedral (e.g. hexahedral) structure constituted of silicon atoms and oxygen atoms, with each side having a nano order size (e.g. 0.5 nm). In this sense, a silicon resin cured material of a caged-silsesquioxane is also called as nano resin.

For instance, a cured TCHS is obtained by subjecting a hydrogen atom bound to a silicon atom, and a group having a carbon-carbon unsaturated bond to hydrosilylation reaction for addition polymerization. Performing the above reaction yields a 3-dimensional crosslinked structure, wherein nano-sized caged-silsesquioxane compounds are bound by organic segments. The thus formed silicon resin cured material has a glass-like property that the cured material is less likely to be deteriorated against long-time irradiation of blue or near ultraviolet light. In other words, the resin protector 27 made of the resin is a transparent resin member which is less likely to cause deterioration in light transmittance.

Figure 5:
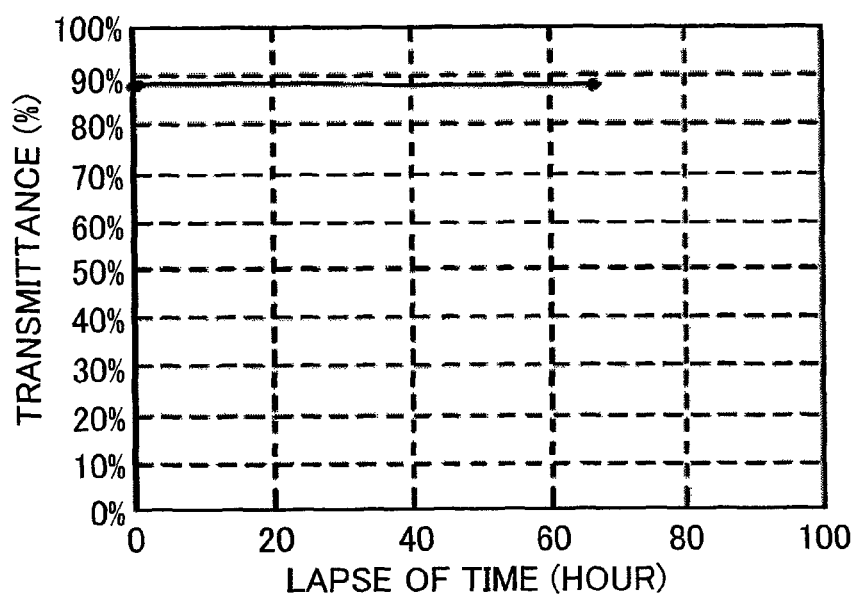
FIG. 5 is a graph showing a change in light transmittance of a cured TCHS with time, in the case where blue laser light was continuously irradiated at an irradiation density of 2.2 $W/mm^2$.

FIG. 5 is a graph showing a change in transmittance of a cured TCHS having a thickness of 0.5 mm with time, in the case where condensed blue laser light of 405 nm wavelength (hereinafter, also simply called as blue laser light) was continuously irradiated at an irradiation density of 2.2 W/mm$^2$, wherein the cured material is obtained by subjecting TCHS to a curing treatment in a condition substantially the same as the condition of forming the resin protector 27.

As is obvious from the graph of FIG. 5, the transmittance of the cured TCHS subjected to continuous irradiation of blue laser light was hardly lowered after 67 hour irradiation. Accordingly, it is obvious that the light transmittance of the cured TCHS is not significantly lowered, even if blue laser light is continuously irradiated for a long time.

Figure 6:
FIG. 6 is a diagram showing far field patterns on a cured TCHS before blue laser light is irradiated, and after blue laser light was continuously irradiated at an irradiation density of 2.2 $W/mm^2$ for 67 hours.

FIG. 6 is a diagram showing far field patterns on a cured TCHS before blue laser light is irradiated, and after blue laser light was continuously irradiated at an irradiation density of 2.2 W/mm$^2$ for 67 hours. Referring to FIG. 6, a far field pattern before light irradiation is shown on the left side, and a far field pattern after 67 hour irradiation is shown on the right side. As is obvious from FIG. 6, a significant change in far field pattern on the cured TCHS was observed before and after irradiation.

The above result shows the following. In the case where blue laser light was continuously irradiated at an irradiation density of 2.2 W/mm$^2$, the light transmittance of the cured TCHS was hardly lowered. On the other hand, the far field patterns on the cured TCHS was changed before and after irradiation. Therefore, it is obvious that the blue laser was slightly damaged, in the case where blue laser light was continuously irradiated at an irradiation density of 2.2 W/mm$^2$ for 67 hours.

Figure 7:
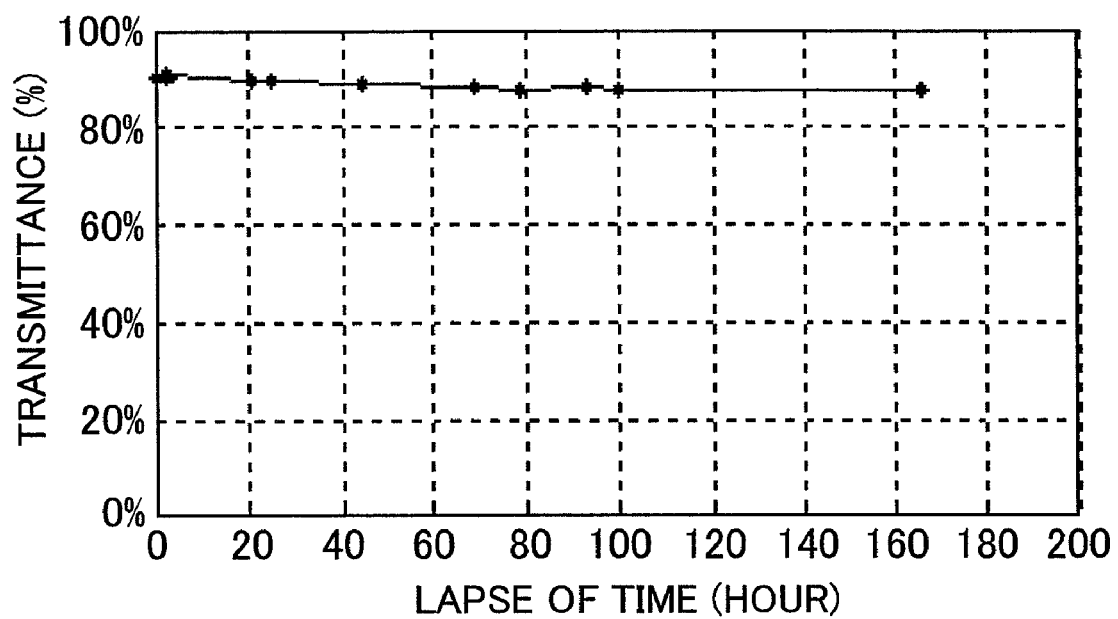
FIG. 7 is a graph showing a change in light transmittance of a cured TCHS with time, in the case where blue laser light was continuously irradiated at an irradiation density of 40 $mW/mm^2$.

FIG. 7 is a graph showing a change in light transmittance of a cured TCHS with time, in the case where blue laser light was continuously irradiated at an irradiation density of 40 mW/mm$^2$. As is obvious from the graph of FIG. 7, the light transmittance of the cured material was not significantly lowered, even if blue laser light having a power density of 40 mW/mm$^2$ was continuously irradiated for about 170 hours.

Figure 8:
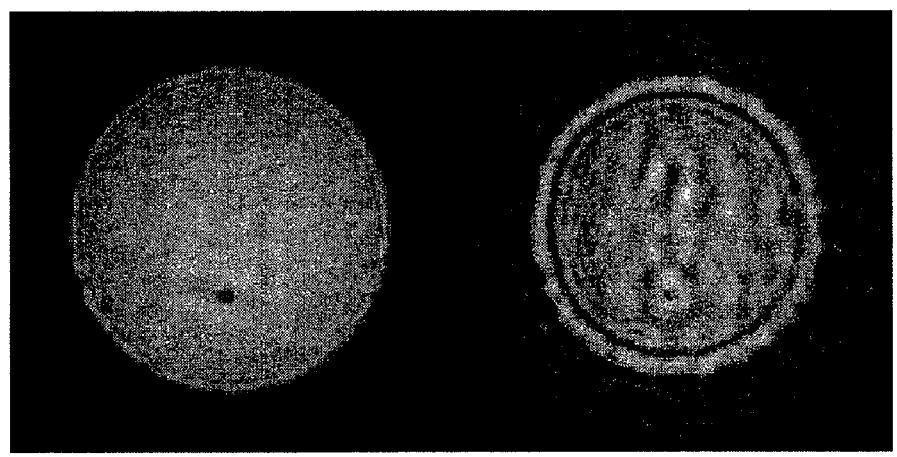
FIG. 8 is a diagram showing far field patterns on a cured TCHS before blue laser light is irradiated, and after blue laser light was continuously irradiated at an irradiation density of 40 $mW/mm^2$ for 72 hours.

FIG. 8 is a diagram showing far field patterns on a cured TCHS before blue laser light is irradiated, and after blue laser light was continuously irradiated at an irradiation density of 40 mW/mm$^2$ for 72 hours. The change in far field pattern by continuous irradiation of blue laser light at an irradiation density of 40 mW/mm$^2$ in FIG. 8 was small, as compared with the change in far field pattern by continuous irradiation of blue laser light at an irradiation density of 2.2 W/mm$^2$ in FIG. 6. However, even with an irradiation at an irradiation density of 40 mW/mm$^2$, a slight change in far field pattern was observed.

The above result shows the following. Even if blue laser light was continuously irradiated at an irradiation density of 40 mW/mm$^2$ for about 170 hours, the light transmittance of the cured TCHS was not significantly lowered. On the other hand, there was observed a certain degree of change in far field pattern, in the case where blue laser light was continuously irradiated at an irradiation density of 40 mW/mm$^2$ for 72 hours. This result shows that the blue laser was slightly damaged even with an irradiation at an irradiation density of 40 mW/mm$^2$.

Figure 9:
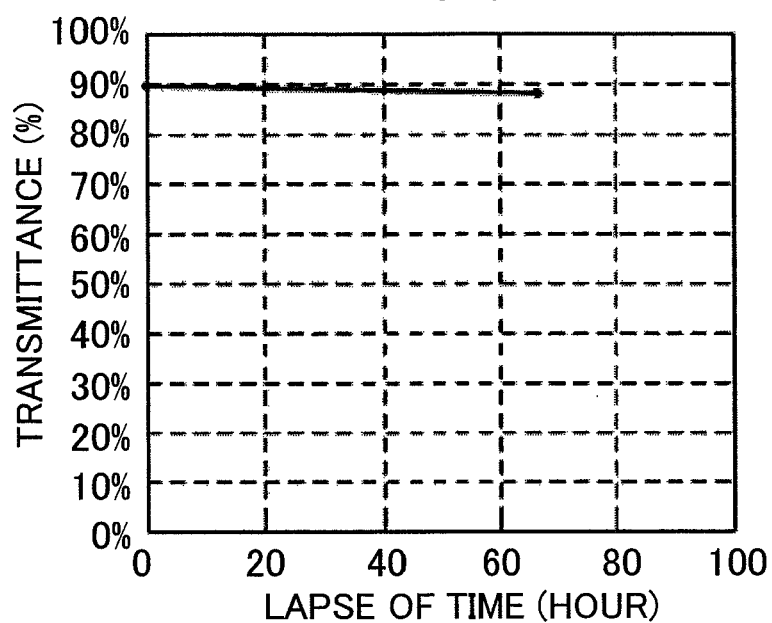
FIG. 9 is a graph showing a change in transmittance of a cured general silicone resin with time, in the case where blue laser light was continuously irradiated at an irradiation density of 2.2 $W/mm^2$.

FIG. 9 is a graph showing a change in transmittance of a cured material with time, as a comparative example, in the case where blue laser light was continuously irradiated at an irradiation density of 2.2 W/mm$^2$, wherein the cured material is substantially equivalent thickness to the cured TCHS having a thickness of 0.5 mm, and was produced by using a general silicone resin (KE-106 of Shinetsu Silicone K. K.). As is obvious from the result shown in the graph of FIG. 9, the transmittance of the general silicone resin cured material was not significantly lowered by irradiation at an irradiation density of 2.2 W/mm$^2$. Also, there is no significant difference in transmittance with time between the cured TCHS in the graph of FIG. 5, and the general silicone resin cured material in the graph of FIG. 9.

Figure 10:
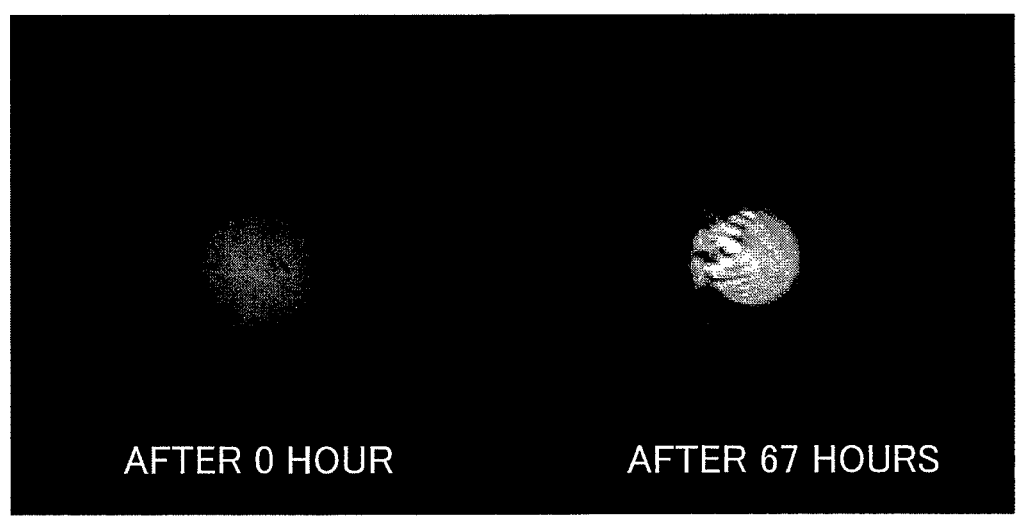
FIG. 10 is a diagram showing far field patterns on the cured general silicone resin before blue laser light is irradiated, and after blue laser light was continuously irradiated at an irration density of 2.2 $W/mm^2$ for 67 hours.

FIG. 10 is a diagram showing far field patterns on the general silicone resin cured material before blue laser light is irradiated, and after blue laser light was continuously irradiated at an irradiation density of 2.2 W/mm$^2$ for 67 hours.

Comparing the change in far field pattern on the cured TCHS in FIG. 6, and the change in far field pattern on the general silicone resin cured material in FIG. 10, it is obvious that the change in far field pattern on the cured TCHS before and after irradiation is smaller.

Figure 11:
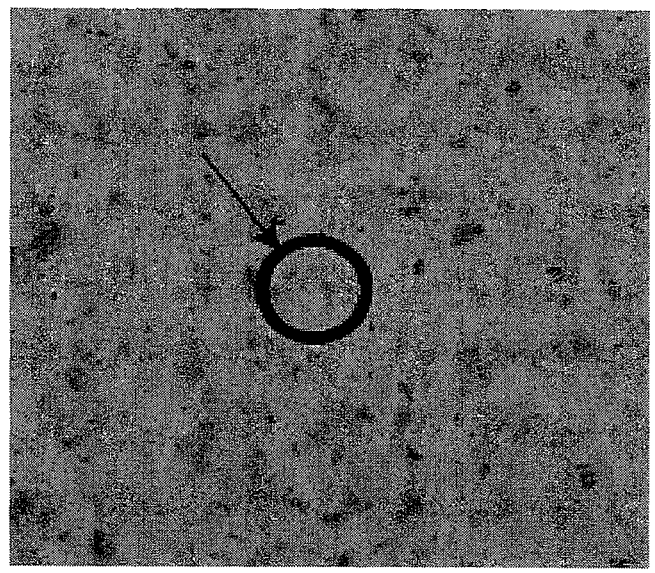
FIG. 11 is an optical micrograph showing an irradiation spot and its vicinity on a cured TCHS, in the case where blue laser light was continuously irradiated at an irradiation density of 2.2 $W/mm^2$ for 67 hours.
Figure 12:
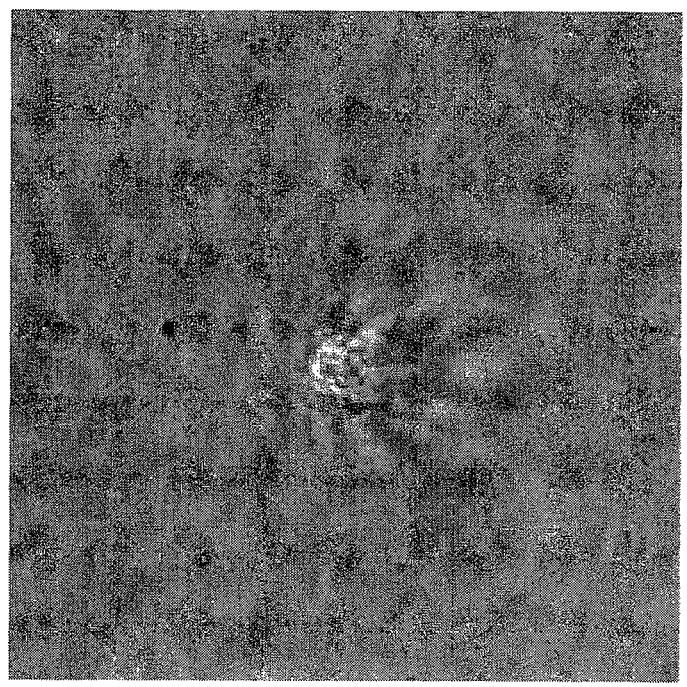
FIG. 12 is an optical micrograph showing an irradiation spot and its vicinity on a cured general silicone resin, in the case where blue laser light was continuously irradiated at an irradiation density of 2.2 $W/mm^2$ for 67 hours.

FIG. 11 is an optical micrograph showing an irradiation spot and its vicinity on a cured TCHS, in the case where blue laser light was continuously irradiated at an irradiation density of 2.2 W/mm$^2$ for 67 hours. FIG. 12 is an optical micrograph showing an irradiation spot and its vicinity on a cured general silicone resin, in the case where blue laser light was continuously irradiated at an irradiation density of 2.2 W/mm$^2$ for 67 hours. An irradiation trace was not recognized on the cured TCHS in the optical micrograph of FIG. 11. However, a wrinkle-like irradiation trace was obviously recognized on the general silicone resin cured material in the optical micrograph of FIG. 12.

Figure 13:
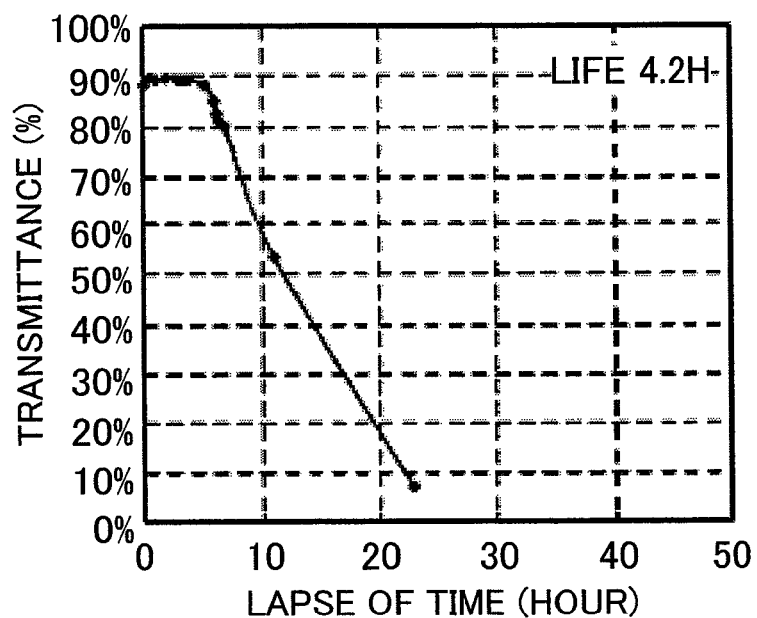
FIG. 13 is a graph showing a change in transmittance of a cured transparent salicylic epoxy resin with time, in the case where blue laser light was continuously irradiated at an irradiation density of 2.2 W/mm$^2$.

FIG. 13 is a graph showing a change in transmittance of a cured material having a thickness of 0.5 mm with time, as a comparative example, in the case where blue laser light was continuously irradiated at an irradiation density of 2.2 W/mm$^2$, wherein the cured material was obtained by using a commercially available transparent salicylic epoxy resin (CELLOXIDE 2021 of Daicel Chemical Industries, Ltd.) as a material for the resin protector. As is obvious from the result shown in the graph of FIG. 13, the transmittance of the salicylic epoxy resin cured material considerably started lowering after about 6 hour irradiation, and was lowered below 10% after 22 hour irradiation.

Figure 14:
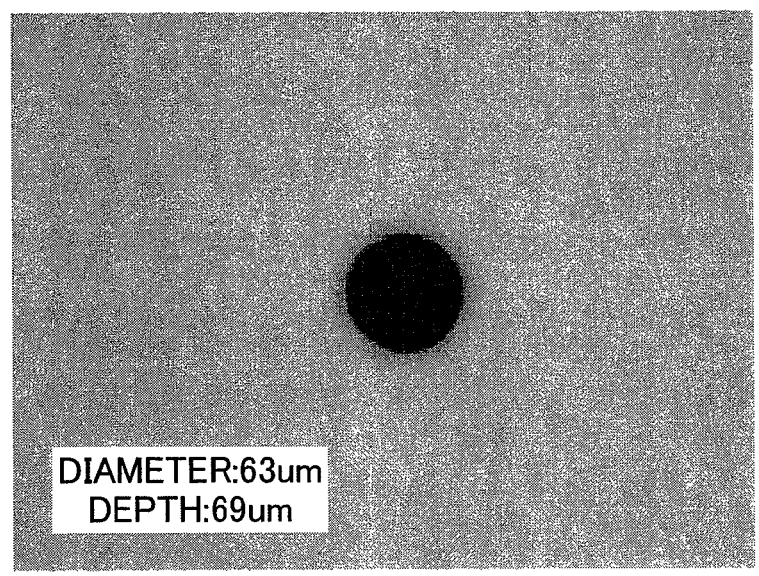
FIG. 14 is an optical micrograph of a cured transparent salicylic epoxy resin in the case where blue laser light was continuously irradiated at an irradiation density of 2.2 W/mm$^2$ for 22 hours.

FIG. 14 is an optical micrograph showing an irradiation spot and its vicinity on a cured salicylic epoxy resin, in the case where blue laser light was continuously irradiated at an irradiation density of 2.2 W/mm$^2$ for 22 hours. As is obvious from the optical micrograph of FIG. 14, an irradiation trace of several ten μm in diameter was formed at the irradiation spot on the salicylic epoxy resin cured material. Also, the irradiation trace had a depth of several ten pm, as a result of calculation based on a focal length at a bottom portion of the irradiation trace.

As described above, it is obvious that deterioration of the cured silsesquioxane resin concerning all the evaluation criteria i.e. a change in transmittance of a cured material with time, a change in far field pattern before and after light irradiation, and micrographic observation of an irradiation spot after light irradiation by continuous irradiation of blue laser light at an irradiation density of 2.2 W/mm$^2$ was smaller, as compared with the cured general silicone resin and a transparent salicylic epoxy resin. Also, there was observed a change in far field pattern on the cured silicon resin composition containing TCHS.

Another optical head was fabricated in the similar manner as described above except that a silicon resin cured material of a resin composition obtained by adding 18.75 μL of 3.0×10$^{-3}$ wt % Pt (cts) toluene solution to 1 g of purified tetallylsilsesquioxane by homogeneous mixing was used as a material for the resin protector, in place of the silicon resin cured material of a silicon resin composition containing TCHS. The resin composition was subjected to heat molding into a resin protector in the heated air of about 120° C. for about 3 hours. By heat molding, addition polymerization reaction of a hydrogen atom bound to a silicon atom, and a vinyl group at a terminal of a molecular chain bound to a silicon atom between adjacent molecules of tetraallylsilsesquioxane progresses.

Figure 15:
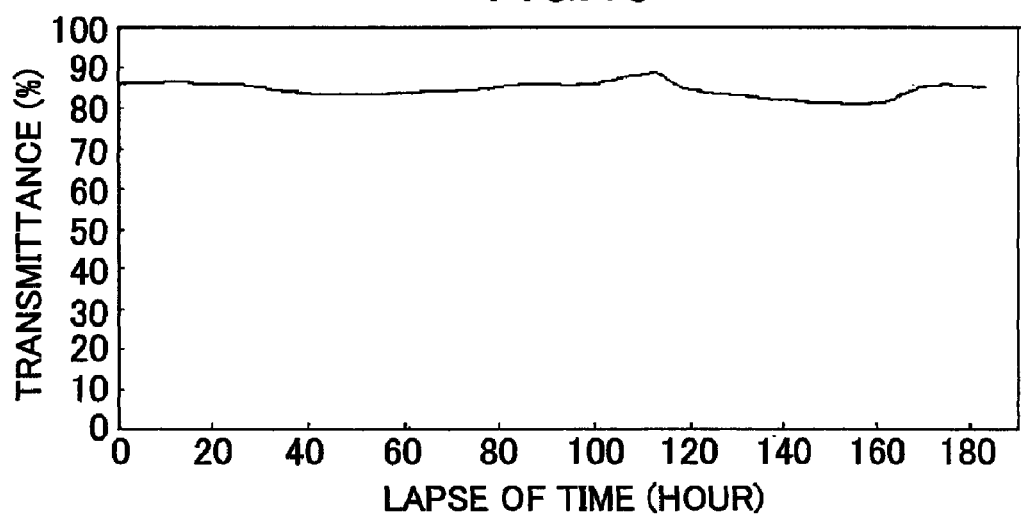
FIG. 15 is a graph showing a change in transmittance of a plate made of a cured tetraallylsilsesquioxane with time, in the case where blue laser light was continuously irradiated at an irradiation density of 1.1 W/mm$^2$.
Figure 16:
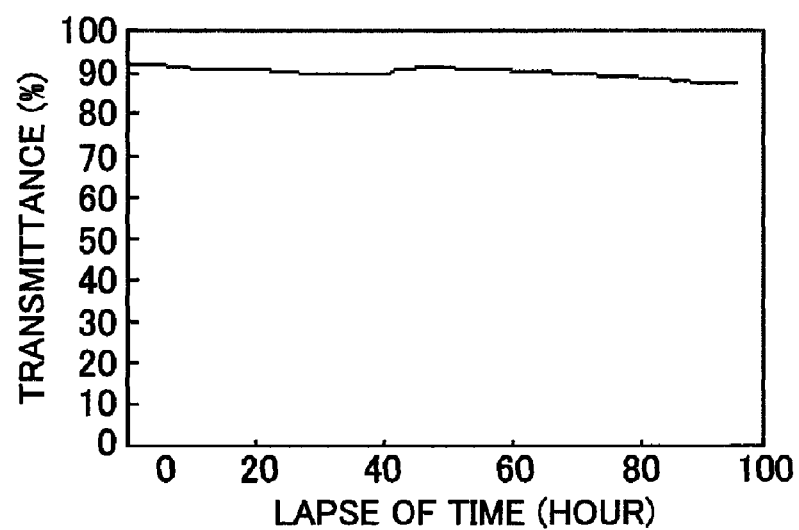
FIG. 16 is a graph showing a change in transmittance of a cured TCHS with time, in the case where blue laser light was continuously irradiated at an irradiation density of 1.1 W/mm$^2$.

FIG. 15 is a graph showing a change in transmittance of a cured material having a thickness of 0.5 mm with time, in the case where condensed blue laser light was continuously irradiated at an irradiation density of 1.1 W/mm$^2$, wherein the cured material was obtained by subjecting tetraallylsilsesquioxane to a curing treatment in a condition substantially the same as the condition of forming the resin protector. FIG. 16 is a graph showing a change in transmittance of the cured TCHS having a thickness of 0.5 mm with time, in the case where condensed blue laser light of 405 nm wavelength was continuously irradiated at an irradiation density of 1.1 W/mm$^2$.

As is obvious from the results shown in the graphs of FIGS. 15 and 16, the transmittances of both the cured tetraallylsilsesquioxane and the cured TCHS were hardly lowered, in the case where blue laser light was continuously irradiated at an irradiation density of 1.1 W/mm$^2$. Accordingly, it is evaluated that there is no significant difference in light transmittance change with time concerning both of the cured tetrallylsilsesquioxane and the cured TCHS.

Figure 17:
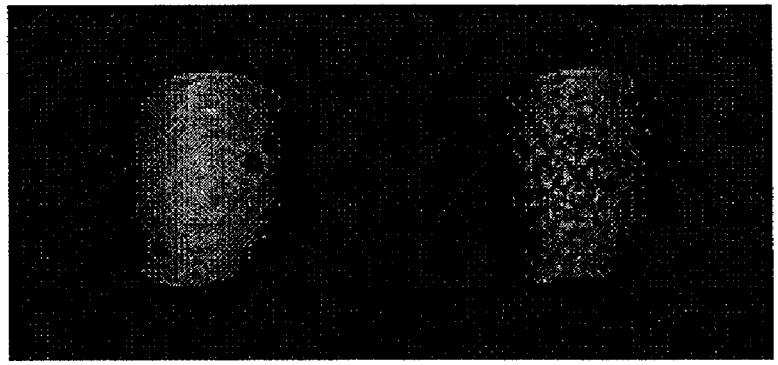
FIG. 17 is a diagram showing far field patterns on a cured tetraallylsilsesquioxane before blue laser light is irradiated, and after blue laser light was continuously irradiated at an irradiation density of 1.1 W/mm$^2$ for 72 hours.
Figure 18:
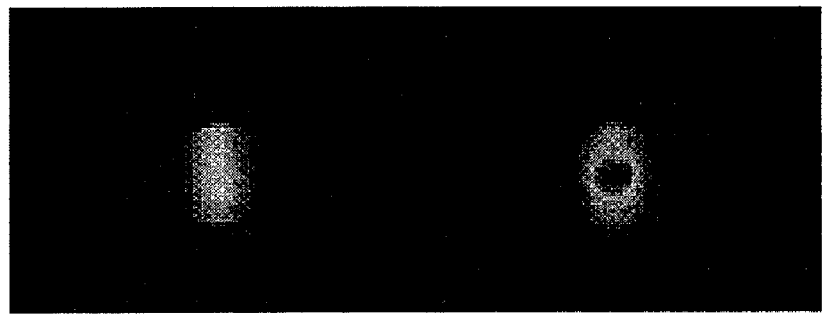
FIG. 18 is a diagram showing far field patterns on a cured TCHS before blue laser light is irradiated, and after blue laser light was continuously irradiated at an irradiation density of 1.1 W/mm$^2$ for 72 hours.

FIG. 17 is a diagram showing far field patterns on the cured tetrallylsilsesquioxane before blue laser light is irradiated, and after blue laser light was continuously irradiated at an irradiation density of 1.1 W/mm$^2$ for 72 hours. FIG. 18 is a diagram showing far field patterns on the cured TCHS before blue laser light is irradiated, and after blue laser light was continuously irradiated at an irradiation density of 1.1 W/mm$^2$ for 72 hours. As shown in FIG. 17, concerning the cured tetrallylsilsesquioxane, no dark spot was observed, although there was observed a certain change in far field pattern after 72 hour irradiation. On the other hand, as shown in FIG. 18, the far field pattern on the cured TCHS was greatly changed after 72 hour irradiation, and a dark spot appeared on a center portion of the cured TCHS. Thus, comparing the change in far field pattern on the cured tetrallylsilsesquioxane in FIG. 17, and the change in far field pattern on the cured TCHS in FIG. 18, it is obvious that the change in far field pattern on the cured tetrallylsilsesquioxane is smaller.

Figure 19:
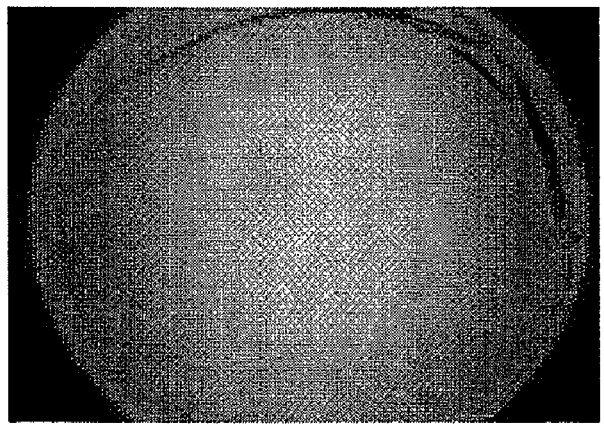
FIG. 19 is a polarizing microscopic photograph showing an irradiation spot and its vicinity on a cured tetraallylsilsesquioxane, in the case where blue laser light was irradiated at an irradiation density of 1.1 W/mm$^2$ for 72 hours.
Figure 20:
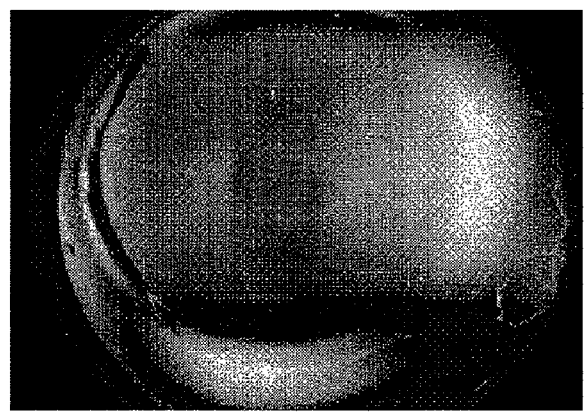
FIG. 20 is a polarization microscopic photograph of an irradiation spot and its vicinity on a cured TCHS, in the case where blue laser light was irradiated at an irradiation density of 1.1 W/mm$^2$ for 72 hours.

FIG. 19 is a polarzing microscopic photograph (by Senarmont observation) showing an irradiation spot and its vicinity on the cured tetrallylsilsesquioxane, in the case where blue laser light was irradiated at an irradiation density of 1.1 W/mm$^2$ for 72 hours. FIG. 20 is a polarization microscopic photograph of an irradiation spot and its vicinity on the cured TCHS, in the case where blue laser light was irradiated at an irradiation density of 1.1 W/mm$^2$ for 72 hours. As compared with the polarizing microscopic photograph of FIG. 20 showing the cured TCHS, the polarizing microscopic photograph of FIG. 19 showing the cured tetrallylsilsesquioxane shows that the damage of the irradiating portion of the blue laser was less, and an irradiation trace was hardly recognized.

The above result shows that, as compared with the cured TCHS, the cured tetrallylsilsesquioxane has a higher resistance to blue laser light. Conceivably, the following is the reason for the result.

A functional group which contributes to crosslinking reaction in TCHS is a cyclic unsaturated double bond. A functional group which contributes to crosslinking reaction in tetrallylsilsesquioxane is a chain unsaturated double bond. In the crosslinking reaction between unsaturated double bond and —SiH, the cyclic unsaturated double bond has a large steric hindrance. Crosslinking reaction may be retarded by the steric hindrance. As a result, unreacted unsaturated double bonds may be left as residues in a cured material subjected to crosslinking reaction. Since the unreacted unsaturated double bonds are chemically unstable, resistance to blue laser light is low. Accordingly, in the case where blue laser light having a high energy density is irradiated, undesirable reaction may occur, with the result that deterioration of the cured material may occur with time. On the other hand, in the crosslinking reaction between chain unsaturated double bond and —SiH, the chain unsaturated double bond has high reactivity, because of a small steric hindrance. In other words, unsaturated double bond and —SiH are liable to be subjected to crosslinking. Accordingly, unreacted unsaturated double bonds are less likely to be left as residues in a cured material containing chain unsaturated double bonds subjected to crosslinking. As a result, deterioration of the cured material with time is less likely to occur, even if blue laser light having a high energy density is irradiated.

Another optical head is fabricated in the similar manner as described above except that a silicon resin cured material of a silicon resin composition obtained by adding 15.2 μL of 3.0×10$^{-3}$ wt % Pt (cts) toluene solution to 1 g of purified diallylsilsesquioxane and 0.315 g of divinyltetramethyldisiloxane by homogeneous mixing was used as a material for the resin protector 27, in place of the silicon resin cured material of the silicon resin composition containing TCHS. The resin composition is subjected to heat molding in the heated air of about 120° C. for about 3 hours.

Diallylsilsesquioxane is a compound expressed by the general formula (2), where t=8, r=2, s=6, $R^1$, $R^2$, $R^5$, and $R^6$ are each a methyl group, A is an allyl group, and $B^1$ is a hydrogen atom, and is a compound expressed by the formula (8).

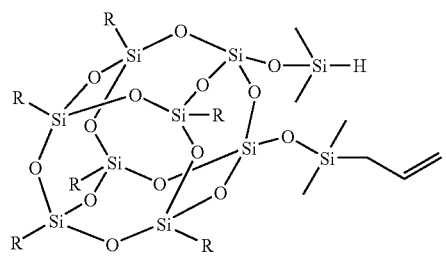

where, in the structural formula (8), R each is an allyldimethylsiloxane group ($—O—Si(CH_3)_2—CH_2—CH=CH_2$) or a dimethylsiloxane group ($—O—Si(CH_3)_2H$), and two allyldimethylsiloxane groups and six dimethylsiloxane groups are contained in a molecule.

The following crosslinked structure is formed by subjecting a hydrogen atom bound to a silicon atom of diallylsilsesquioxane, and a vinyl group at a terminal of a molecular chain bound to a silicon atom between adjacent molecules of diallylsilsesquioxane to addition polymerization, wherein a vinyl group of divinyltetramethyldisiloxane is also involved in the addition polymerization reaction. Diallylsilsesquioxane is cured by the addition polymerization reaction.

far field pattern on the cured material was hardly changed after 240 hour irradiation. As compared with the change in far field pattern on the cured TCHS in FIG. 18, it is obvious that the cured material of diallylsilsesquioxane using a crosslinking agent has a higher resistance to blue laser light irradiation.

Figure 23:
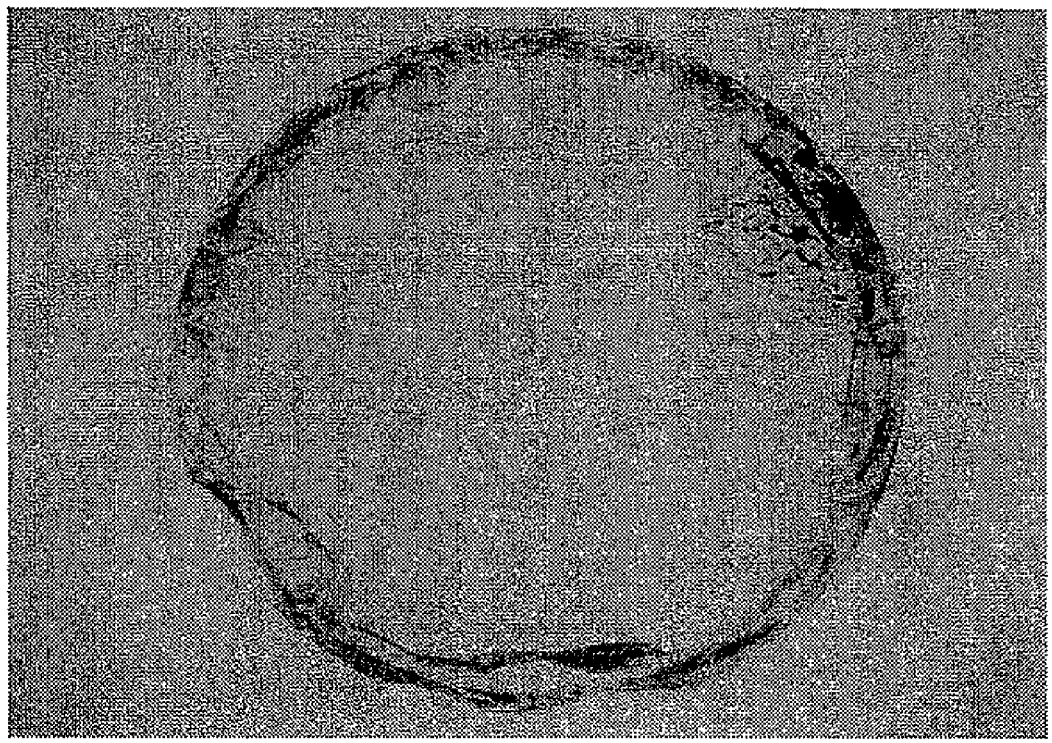
FIG. 23 is a polarizing microscopic photograph of an irradiation spot and its vicinity on the cured diallylsilsesquioxane using divinyltetramethyldisiloxane as a crosslinking agent, in the case where blue laser light was irradiated at an irradiation density of 1.1 W/mm$^2$ for 240 hours.

FIG. 23 is a polarizing microscopic photograph of an irradiation spot and its vicinity on the cured diallylsilsesquioxane using divinyltetramethyldisiloxane as a crosslinking agent, in the case where blue laser light was irradiated at an irradiation density of 1.1 W/mm² for 240 hours. The microscopic photograph of FIG. 23 shows that there is no irradiation trace on the cured diallylsilsesquioxane using a crosslinking agent after 240 hour irradiation.

The above result shows that the cured diallylsilsesquioxane using a crosslinking agent has a higher resistance to blue laser light, as compared with the cured TCHS and the cured tetraallylsilsesquioxane.

Figure 24:
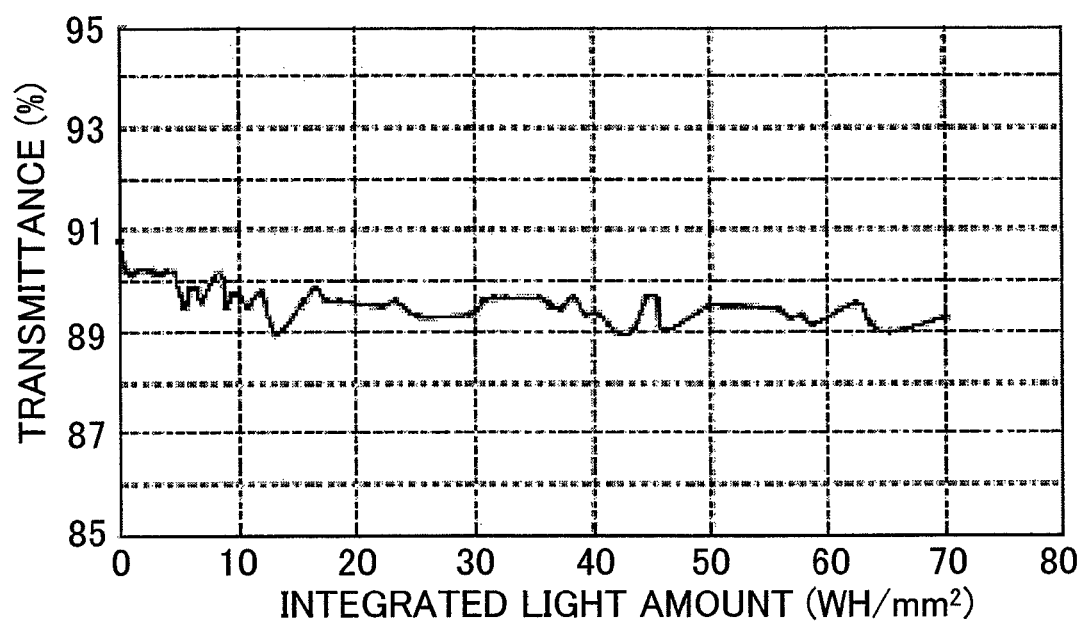
FIG. 24 is a graph showing a change in transmittance of the cured diallylsilsesquioxane using divinyltetramethyldisiloxane as a crosslinking agent with time, in the case where blue laser light was continuously irradiated at an irradiation density of 40 mW/mm$^2$ for 1750 hours.

FIG. 24 is a graph showing a change in transmittance of the cured material of diallylsilsesquioxane using divinyltetramethyldisiloxane as a crosslinking agent with time, in the case where blue laser light was continuously irradiated at an irradiation density of 40 W/mm². As is obvious from FIG. 24, the transmittance of the cured material was hardly lowered even if blue laser light was continuously irradiated for about 1700 hours (integrated light amount: 70 W/mm²).

Figure 25:
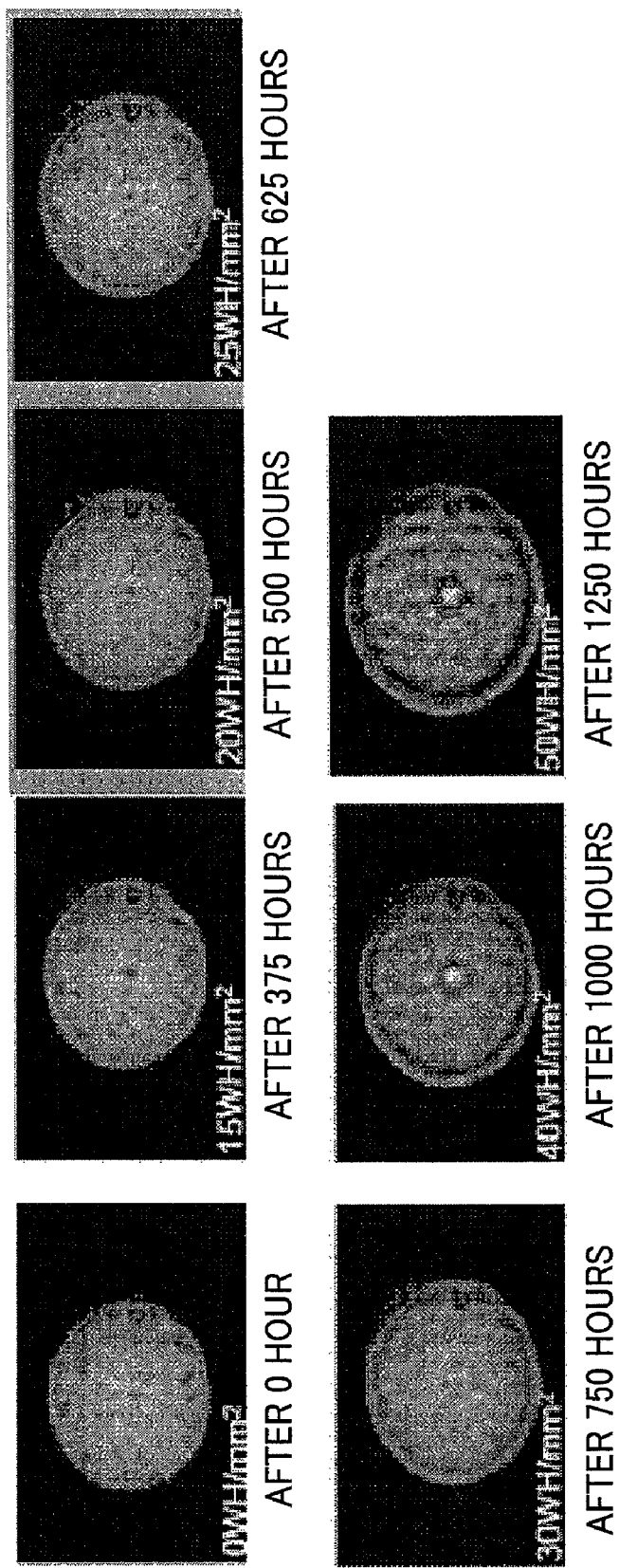
FIG. 25 is a diagram showing a change in far field pattern on the cured diallylsilsesquioxane using divinyltetramethyldisiloxane as a crosslinking agent with time, in the case where blue laser light was irradiated at an irradiation density of 40 mW/mm$^2$ for 1250 hours.

FIG. 25 is a diagram showing a change in far field pattern on the cured material of diallylsilsesquioxane using divinyltetramethyldisiloxane as a crosslinking agent with time, in the case where blue laser light was irradiated at an irradiation density of 40 W/mm² for 1250 hours. As is obvious from FIG. 25, the far field image was hardly changed until 625 hour irradiation, which shows that the cured material has a significantly high resistance to blue laser light irradiation.

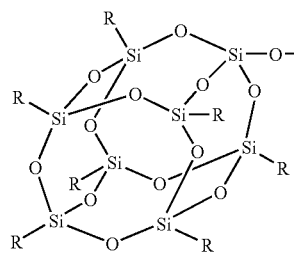 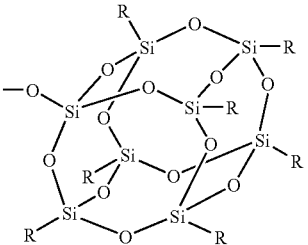

Figure 21:
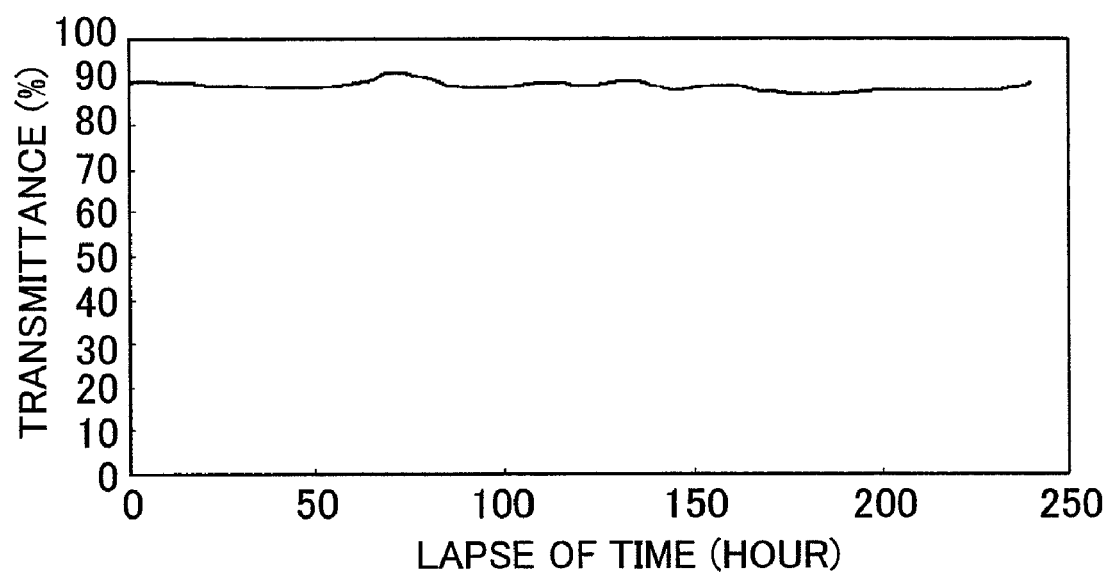
FIG. 21 is a graph showing a change in transmittance of a cured diallylsilsesquioxane using divinyltetramethyldisiloxane as a crosslinking agent with time, in the case where blue laser light was continuously irradiated at an irradiation density of 1.1 W/mm$^2$.

FIG. 21 is a graph showing a change in transmittance of a cured material having a thickness of 0.5 mm with time, in the case where condensed blue laser light was continuously irradiated at an irradiation density of 1.1 W/mm², wherein the cured material was obtained by subjecting diallylsilsesquioxane to a curing treatment, using divinyltetramethyldisiloxane as a crosslinking agent in a condition substantially the same as the condition of forming the resin protector. As is obvious from the result shown in the graph of FIG. 21, the transmittance of the cured material of diallylsilsesquioxane using divinyltetramethyldisiloxane as a crosslinking agent was hardly lowered, in the case where blue laser light was continuously irradiated at an irradiation density of 1.1 W/mm².

Figure 22:
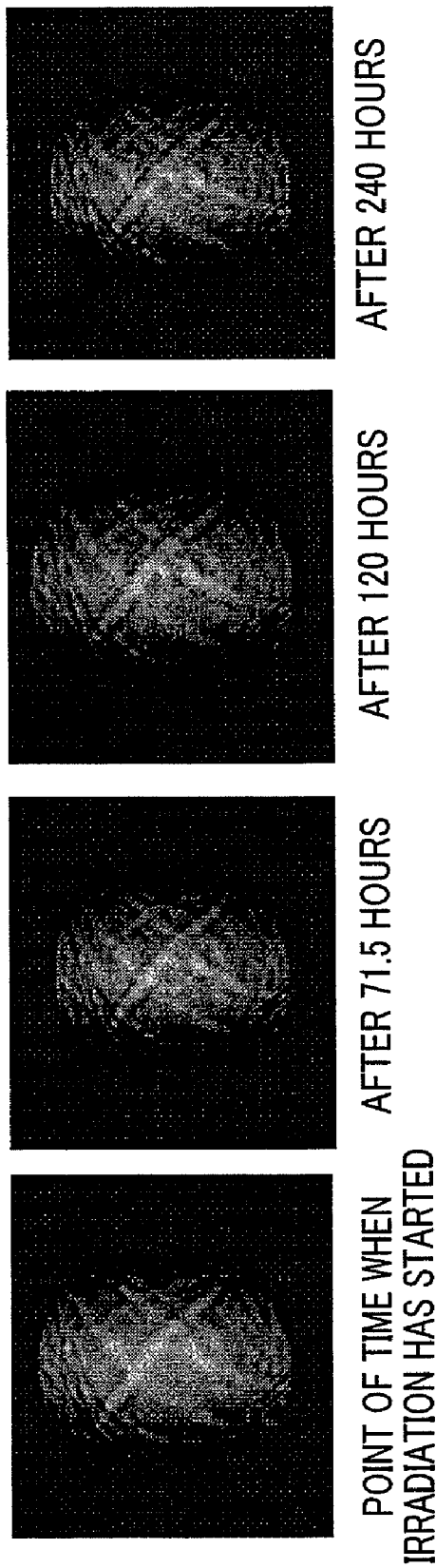
FIG. 22 is a diagram showing a change in far field pattern on the cured diallylsilsesquioxane using divinyltetramethyldisiloxane as a crosslinking agent, in the case where blue laser light was irradiated at an irradiation density of 1.1 W/mm$^2$ for 240 hours.

FIG. 22 is a diagram showing a change in far field pattern on the cured material of diallylsilsesquioxane using divinyltetramethyldisiloxane as a crosslinking agent, in the case where blue laser light was irradiated at an irradiation density of 1.1 W/mm² for 240 hours. As is obvious from FIG. 22, the The above result shows that the cured material of diallylsilsesquioxane using a crosslinking agent has a significantly high resistance to blue laser light. Conceivably, the following is the reason for the result.

In the cured TCHS and the cured tetraallylsilsesquioxane, —SiH bound on a caged structure, and an unsaturated double bond bound on a caged structure are subjected to crosslinking reaction. In the crosslinking reaction, at a point of time when the crosslinking reaction has progressed to a certain degree, the structure is fixed, and reaction freedom is lost, thus further crosslinking reaction is hindered. As a result, a non-homogeneous crosslinked structure is formed, wherein a moiety subjected to crosslinking reaction, and a moiety of unreacted residues coexist. On the other hand, in the case where a silsesquioxane compound is subjected to crosslinkng reaction using a crosslinking agent such a divinyltetramethyldisiloxane, a crosslinked structure is formed between —SiH bound into a cage structure, and an unsaturated double bond bound into a cage structure in the presence of monomers of the crosslinking agent, i.e. reactive monomers having high mobility in the cage structures. As a result, fixation of structures is decelerated, and crosslinking reaction is accelerated. Thereby, unreacted residues are less likely to be formed in the cured material. Also, although unreacted residues are formed during the progress of crosslinking reaction, a crosslinked structure can be formed by crosslinkable monomers having high mobility. Accordingly, conceivably, use of a crosslinking agent is advantageous in reducing the number of unreacted residues in a cured material, and improving resistance to blue laser light irradiation.

Next, another optical head was fabricated in the similar manner as described above except that a silicon resin cured material of a resin composition obtained by adding 14.68 µL of $3.0 \times 10^{-3}$ wt % Pt (cts) toluene solution to 1 g of purified octavinylsilsesquioxane and 0.44 g of tetramethyldisiloxane by homogeneous mixing was used as a material for the resin protector 27, in place of the silicon resin cured material of a silicon resin composition containing TCHS. The resin composition was subjected to heat molding in the heated air of about 120° C. for about 3 hours.

Octavinylsilsesquioxane is a compound expressed by the general formula (2), where t=8, r=8, $R^1$ and $R^2$ are each a methyl group, and A is a vinyl group, and is a compound expressed by the formula (9).

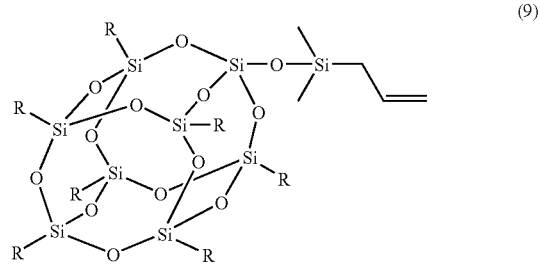

(9)

where, in the structural formula (9), R each is a vinyldimethylsiloxane group (—O—Si(CH$_3$)$_2$—CH=CH$_2$).

In the above reaction, a crosslinked structure is formed by subjecting a vinyl group at a terminal of a molecular chain bound to a silicon atom of octavinylsilsesquioxane via siloxane bonding, and a hydrogen atom bound to a silicon atom of tetramethyldisiloxane, to addition polymerization.

Figure 26:
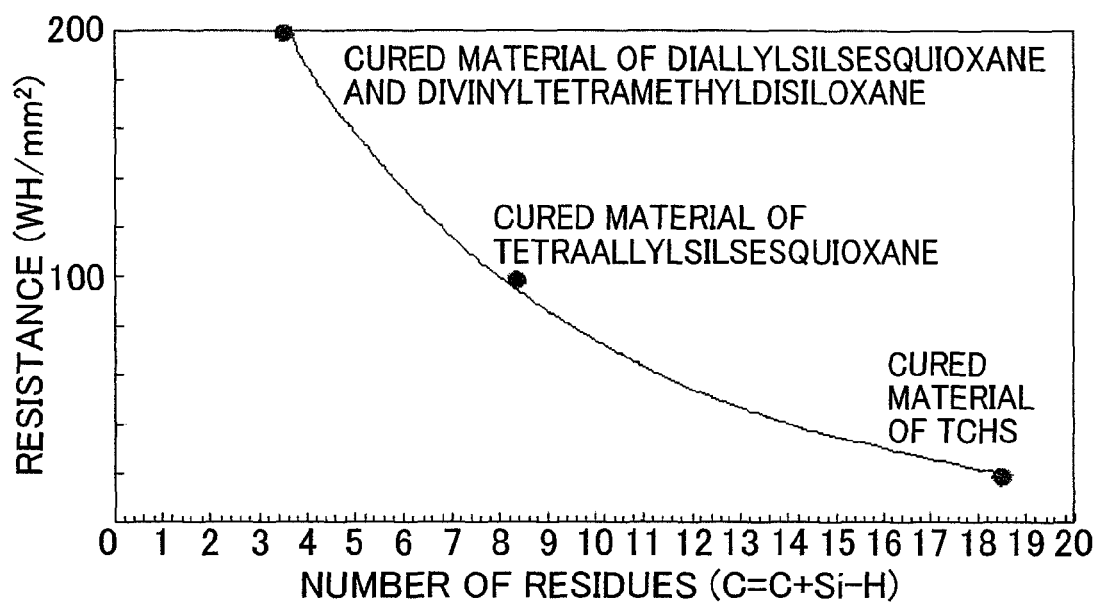
FIG. 26 is a graph showing a relation between the number of residues of unsaturated double bonds and —Si—H groups in each of the cured materials, and resistance to blue laser light.

FIG. 26 is a graph showing a relation between the number of residues of unsaturated double bonds and —Si—H groups in each of the above cured materials, and resistance to blue laser light. The number of residues is the total number of residues of unsaturated double bonds and —Si—H groups measured by Raman spectrophotometry. Resistance to blue laser light is represented by the integrated light amount (unit: WH/mm$^2$) of irradiation light. As is obvious from the graph of FIG. 26, as compared with the cured TCHS, wherein a caged structure constituted of —SiO— has a cyclic and reactive functional group, the cured tetraallylsilsesquioxane having a straight chain functional group has a less number of residues, and a higher resistance. Also, in the case where low molecular reactive monomers are subjected to crosslinking, the number of unreacted residues in the cured material is further reduced. Thus, it is obvious that resistance to blue laser light irradiation is improved.

The above result shows the following. Specifically, in the case where a cured material of a caged-silsesquioxane compound is used as an optical element material, the life of an optical head in an optical information recording and reproducing device incorporated with a light source for emitting light of a high energy density such as blue laser light of 405 nm wavelength can be extended, because there is no or less change in transmittance for a long time, and deterioration by light irradiation. In particular, an optical element having an even higher resistance to light can be obtained by using a cured material of tetrallylsilsesquioxane having a straight chain unsaturated double bond, or a cured material obtained by subjecting a caged-silsesquioxane compound to crosslinking with a crosslinking agent.

In the optical head 10 in accordance with the first embodiment, preferably, the detection lens 6 and the objective lens 2 may also be made of the above silicon resin cured material. Use of the cured material of a caged-silsesquioxane compound for producing the detection lens 6 and the objective lens 2 in the optical head 10 is also advantageous in suppressing lowering in transmittance of light having a high energy density such as blue laser light. This enables to solve a problem that some of the optical elements may reduce the light receiving amount of the light receiving cells 21a and 21b, and the quality of RF signal and servo signal may be deteriorated. Also, a lens with a reduced lowering in transmittance can be fabricated by injection molding. Accordingly, small-sized and axially asymmetrical detection lens 6 and objective lens 2 can be fabricated at a low cost. This enables to miniaturize the optical head, and simplify the construction of the optical elements.

The detection lens 6 and the objective lens 2 may be fabricated by injection molding, using a metal die having a mirror-finished and lens-shaped cavity.

The heat molding condition of the lens may be substantially the same as the molding condition of the resin protector. In heat molding, a pressure keeping may be applied to the cavity portion to improve dimensional precision and plane precision of the lens. A pressure keeping may be applied stepwise.

The optical head 10 in accordance with the first embodiment has a feature that the resin protector 27 of the light receiving element 5, the detection lens 6, and the objective lens 2 are made of the above silicon resin cured material. Accordingly, use of the optical head 10 incorporated with a blue laser for emitting light of 405 nm wavelength is free from a drawback that the transmittance may be lowered, the light receiving amount of the light receiving cells 21a, 21b may be reduced due to resin deterioration, and the quality of RF signal and servo signal may be deteriorated. In the optical head 10, all the optical elements i.e. the resin protector 27, the detection lens 6, and the objective lens 2 are made of the above silicon resin cured material. Alternatively, for instance, one or two of the optical elements may be made of the silicon resin cured material, and the other optical element(s) may be made of a glass material or a like material, as necessary.

(Second Embodiment)

An optical head in accordance with the second embodiment is substantially the same as the optical head in accordance with the first embodiment except that an optoelectronic integrated circuit (OEIC) i.e. an electrical circuit built-in light receiving element having an integrated circuit is used as the light receiving element. In this embodiment, solely the optoelectronic integrated circuit (OEIC) is described in detail.

Figure 27A:
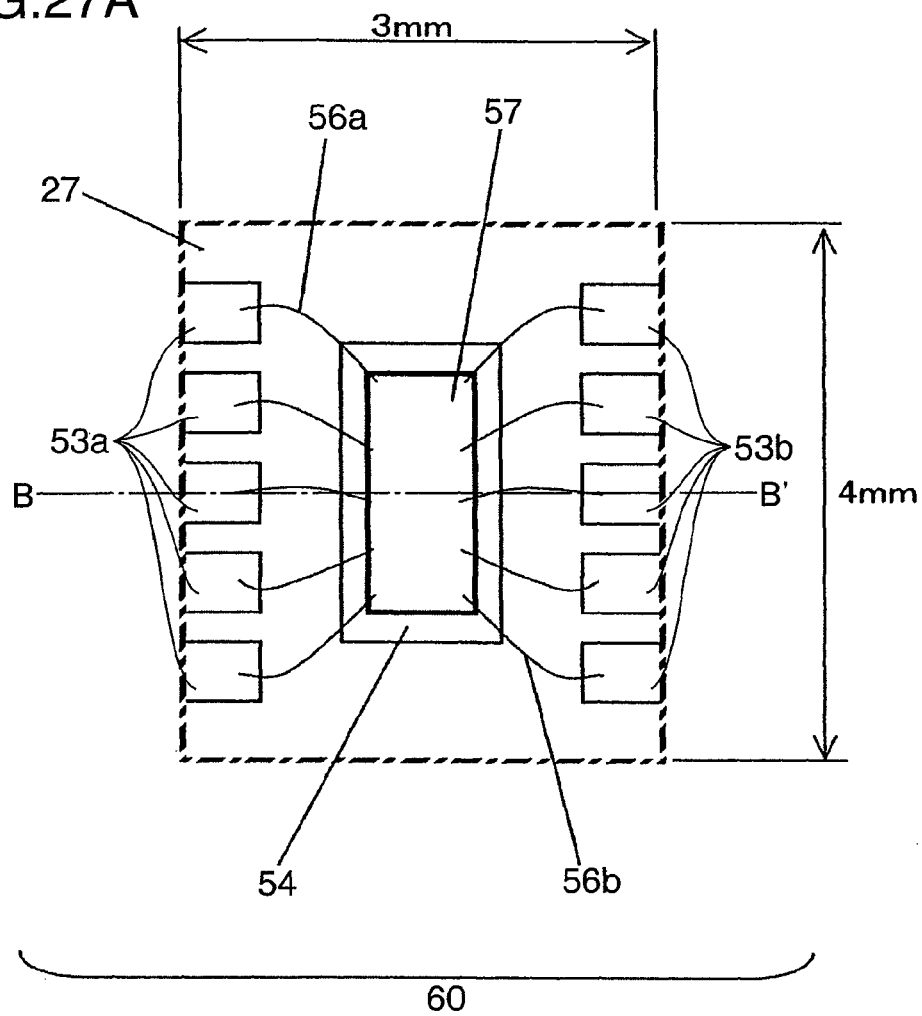
FIG. 27A is a plan view of OEIC as a light receiving element in a second embodiment of the invention.
Figure 27B:
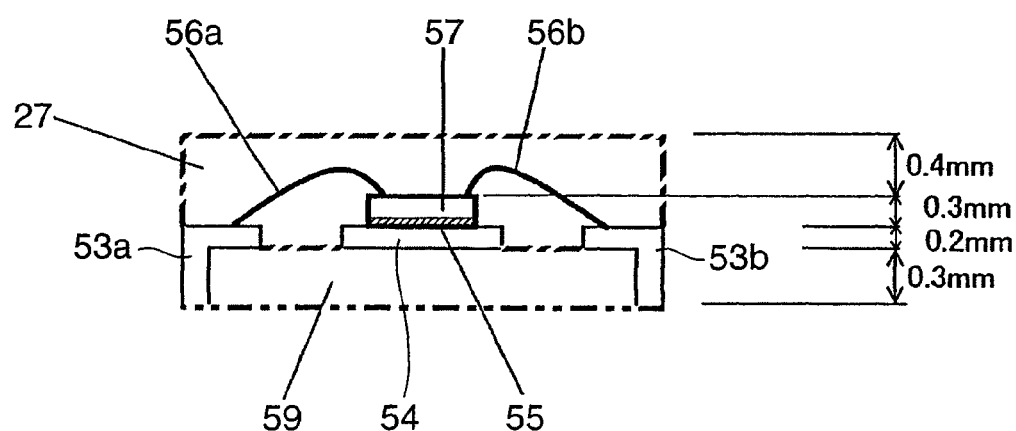
FIG. 27B is a cross-sectional view taken along the line B-B' in FIG. 28A.

FIG. 27A is a plan view of an optoelectronic integrated circuit (OEIC) 60 i.e. an electric circuit built-in light receiving element to be incorporated in the optical head in accordance with the second embodiment, as a light receiving element. FIG. 27B is a cross sectional view taken along the line B-B' in FIG. 27A.

Referring to FIGS. 27A and 27B, the reference numeral 60 indicates an OEIC. 57 indicates a light receiving chip of 0.3 mm in thickness; and having a light receiving cell, and a circuit for amplifying and computing a photocurrent to be outputted from the light receiving cell. 53a and 53b each indicates a frame terminal. 54 indicates a frame member. 55 indicates a lower electrode. 59 indicates a base member. 56a and 56b indicate metal wires for electrically connecting upper electrodes of the light receiving chip 57 to the frame terminals 53a and 53b, respectively. 27 indicates a resin protector which is made of a cured material of a caged-silsesquioxane compound, and is adapted for defining the outer shape of the OEIC 60, with a size of e.g. 3 mm×4 mm in area and 1.2 mm in thickness.

The OEIC 60 is constructed in such a manner that the circuit of the light receiving chip 57 is operable to amplify and compute a photocurrent to output the computation result from the frame terminals 53a and 53b, in addition to a function of converting light received on the light receiving cells of the 2-divided photodiode in the light receiving element 5 described in the first embodiment into a photocurrent.

In the optical head in accordance with the second embodiment, the OEIC 60 shown in FIGS. 27A and 27B is used as the light receiving element 5. Accordingly, there is no need of providing a circuit for amplifying and computing a photocurrent in the optical head 10, in addition to a light receiving element. Also, a compact and thin light receiving element is produced by providing the base member 59, and bending the frame terminals 53a and 53b. Further, forming the frame terminals 53a and 53b into a bent shape realizes electrical connection by a bump method or a like method in loading the light receiving element in a flexible printed circuit board. This enables to reduce the soldering area in loading a light receiving element in an optical head, which is advantageous m producing a compact optical head.

A silicon resin containing the compound substantially identical to the caged-silsesquioxane compound described in the first embodiment may be used as a material for the resin protector 27 of the OEIC 60 in the second embodiment.

A method for producing the OEIC 60 is described as follows.

In the production method, molding is performed in two stages, because the base member 59 and the resin protector 27 are made of materials different from each other.

First, a first die made of a die steel and having a cavity portion, a gate portion, and a runner portion is prepared. The frame member 54 and the base member 59 are positioned in the first die, and subjected to injection molding. Thereby, the frame member 54 and the base member 59 are integrally molded. The resin temperature in the injection molding is different depending on the kind of resin. For instance, the resin temperature is from 230 to 260° C. or higher. The cavity temperature is kept at a constant temperature by cooling the die in water. The cavity temperature is preferably from about 120 to 130° C.

Next, a second die made of a die steel and having a cavity portion, a gate portion, and a runner portion is prepared. The integrally molded product of the frame member 54 and the base member 59 is placed in the cavity portion of the second die, and sandwiched by upper and lower die portions. The gate portion is formed in a joint surface of the cavity corresponding to an outer perimeter of the resin protector 27 in such a manner that the gate portion extends in a direction perpendicular to the frame terminal within the plane of the frame member 54. A molten silicon resin composition is filled in the cavity portion through the gate portion, whereby the outer shape of the 2-divided photodiode 60 is defined. The cavity temperature is kept at a constant temperature of about 200° C. by cooling the die in water. In heat molding, a pressure keeping is applied to the cavity portion. Applying a pressure keeping enables to improve dimensional precision and plane precision of the resin protector 27. A pressure keeping may be applied stepwise. The frame terminals may be integrally with the flame member, in place of individually forming the frame member and the frame terminals. This facilitates positioning the frame member with respect to the cavity. After molding, the frame member is cut into 2-divided photodiodes. This enables to increase the number of mold products taken by one time operation, and enhance productivity.

The following modification may be employed as another method for producing the OEIC 60.

The frame member 54 and the base member 59 are integrally molded by injection molding in the first die in the similar manner as described above. In the modification, a surrounding wall with a height of e.g. 0.7 mm based on the surface of frame member 54 at the side of the light receiving chip is formed in the base member 59, and mounting the light receiving chip 57 and the metal wires 56a and 56b in a recess portion defined by the surrounding wall. The resin temperature in injection molding is different depending on the kind of resin. For instance, the resin temperature is from 230 to 260° C. or higher. The cavity temperature is kept at a constant temperature by cooling the die in water. For instance, the cavity temperature is from 120 to 130° C. i.e. a solidification temperature of the injection resin.

The integrally molded product (the frame member 54 and the base member 59) is surrounded by the surrounding wall, and the light receiving chip 57 is formed into the recess portion with an opening. A molten resin is filled in the recess portion, and subjected to a heat curing treatment into the resin protector 27. In heat molding, a metal die is placed on the recess portion containing the light receiving chip 57, and the recess portion is brought into a cavity portion in a substantially sealed state, in place of filling a resin into the recess portion and subjecting the resin to a heat curing treatment. Then, a pressure keeping is applied to the cavity portion. Applying a pressure keeping enables to improve dimensional precision and plane precision of the resin protector 27. A pressure keeping may be applied stepwise.

(Third Embodiment)

An optical head in accordance with the third embodiment of the invention is described in this section.

Figure 28A:
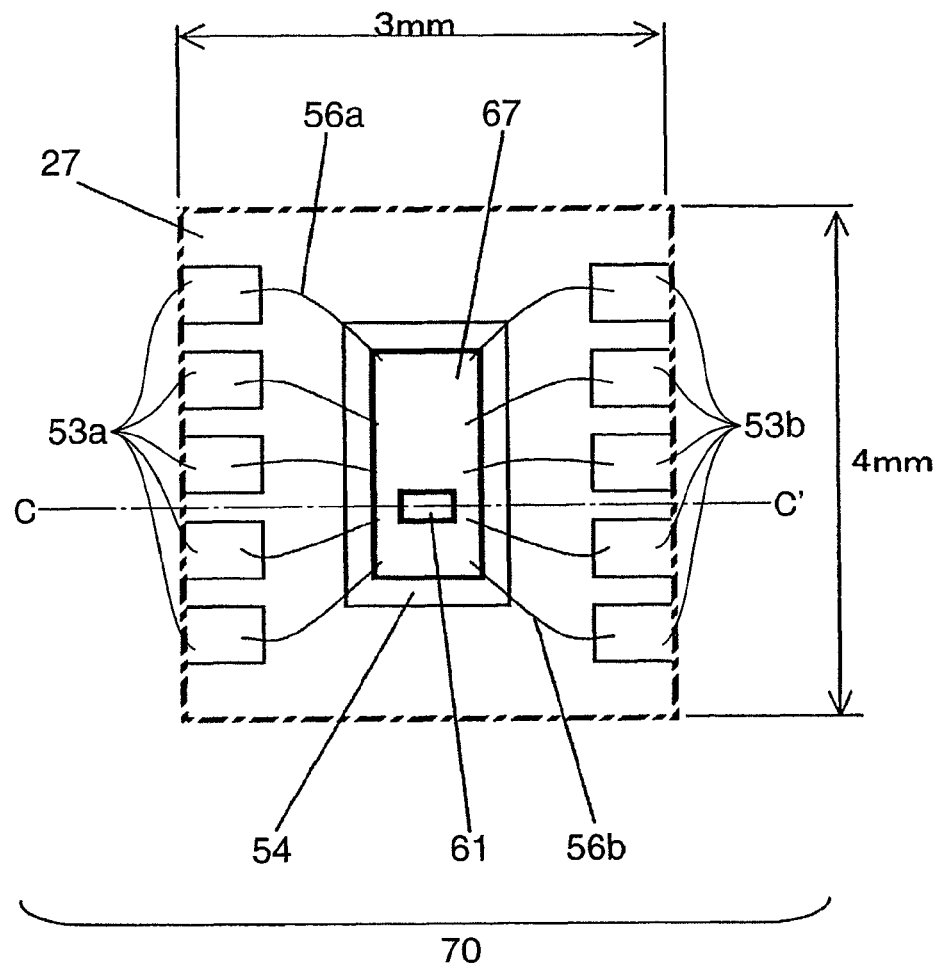
FIG. 28A is a plan view of a light emitting/receiving element in a third embodiment of the invention.
Figure 28B:
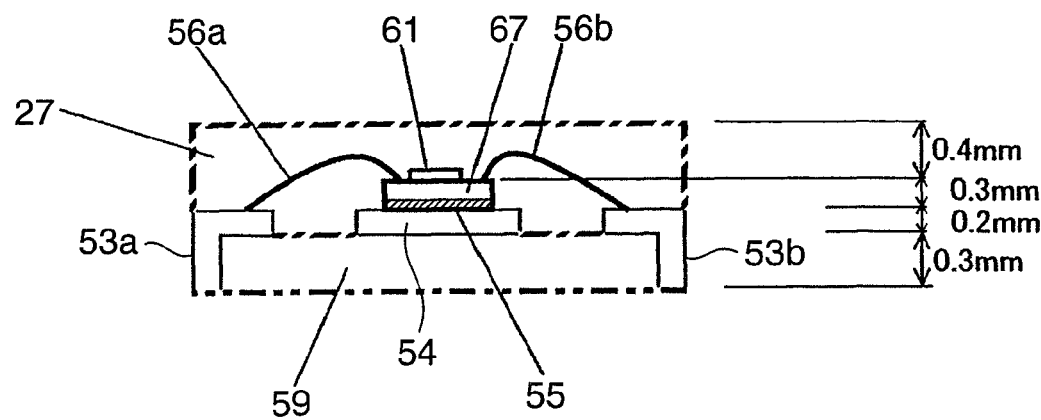
FIG. 28B is a cross-sectional view taken along the line C-C' in FIG. 28A.

FIG. 28A is a plan view of a light emitting/receiving element 70 including a light receiving chip 67 loaded with a semiconductor laser emitter 61 for emitting light of 405 nm wavelength. FIG. 28B is a cross-sectional view taken along the line C-C' in FIG. 28A. The light emitting/receiving element 70 includes the semiconductor laser emitter 61 in addition to the OEIC 60 described in the second embodiment. Specifically, the OEIC 60 has a function substantially equivalent to the function of the semiconductor laser light source 1 to be loaded in the optical head 10 shown in FIG. 1.

Referring to FIGS. 28A and 28B, the reference numeral 70 indicates a light emitting/receiving element. 67 indicates a light receiving chip of 0.3 mm in thickness; and having a light receiving cell, and a circuit for amplifying and computing a photocurrent to be outputted from the light receiving cell. 61 indicates a semiconductor laser emitter loaded on the light receiving chip 67 and for emitting light of 405 nm wavelength in a direction orthogonal to the plane of FIGS. 28A and 28B. 53a and 53b each indicates a frame terminal. 54 indicates a frame member. 55 indicates a lower electrode. 59 indicates a base member. 56a and 56b are metal wires for electrically connecting upper electrodes of the light receiving chip 67 to the frame terminals 53*a* and 53*b*, respectively. 27 indicates a resin protector which is made of a cured material of the caged-silsesquioxane compound, and is adapted for defining the outer shape of the light emitting/receiving element 70 as a light receiving element, with a size of 3 mm×4 mm in area and 1.2 mm in thickness.

In the third embodiment, the resin protector 27 of the light emitting/receiving element 70 shown in FIGS. 28A and 28B is made of the cured material of the caged-silsesquioxane compound free of deterioration against laser light of about 405 nm wavelength. Accordingly, the light emitting/receiving element 70 is free from drawback that the transmittance may be lowered by deterioration of the resin protector 27, and that the quality of RF signal and servo signal may be lowered.

Figure 29:
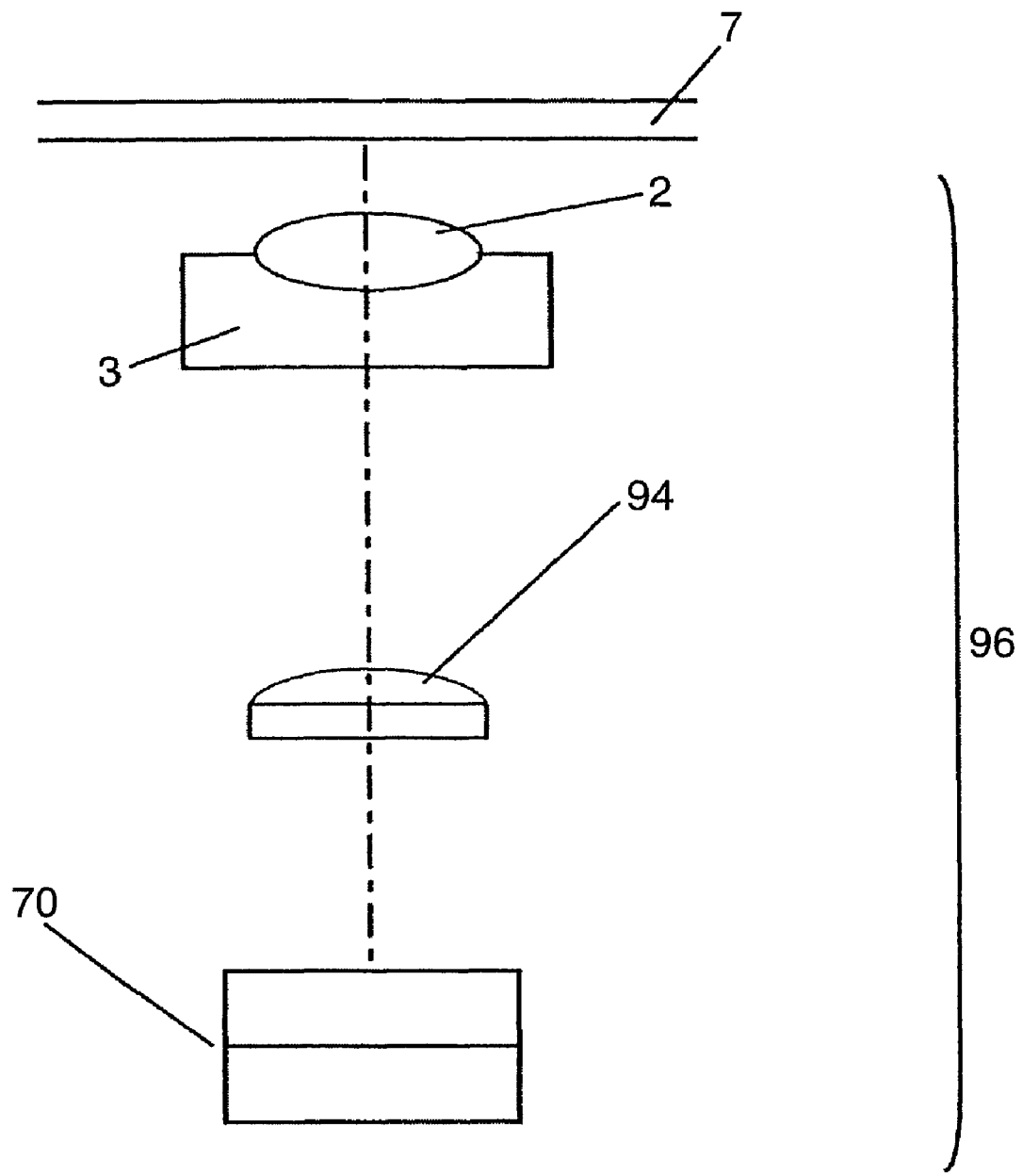
FIG. 29 is a conceptual diagram showing an arrangement of an optical head in accordance with the third embodiment.

In the following, an optical head 96 in accordance with the third embodiment is described in detail. FIG. 29 is a diagram showing the optical head 96 in accordance with the third embodiment. Referring to FIG. 29, the reference numeral 7 indicates an optical disc as an information recording medium. 2 indicates an objective lens as a condensing element. 3 indicates an objective lens actuator as condensing element driving means. 94 indicates a detection lens. The optical head 96 further includes the light emitting/receiving element 70.

Laser light to be emitted from the semiconductor laser emitter 61 loaded on the light emitting/receiving element 70 is transmitted through the detection lens 94, condensed on the objective lens 2, and incident onto the optical disc 7. Laser light reflected on the optical disc 7 is condensed on the detection lens 94, incident onto the light receiving chip 67 of the light emitting/receiving element 70, and converted into a photocurrent.

As described above, in the optical head 96 incorporated with the light emitting/receiving element 70 loaded with the semiconductor laser emitter 61, there is no need of independently providing the semiconductor laser light source 1. Accordingly, this arrangement enables to further reduce the size of an optical head.

In the light receiving elements described in the first through the third embodiments, the light receiving chip and the frame terminal are electrically connected via a metal wire. Alternatively, a light receiving chip and a frame terminal may be electrically connected to each other by a bump method.

In the light receiving elements described in the first through the third embodiments, a COB (chip-on-board) method of directly and electrically connecting a light receiving chip to a flexible printed circuit board for fixing the element via a metal wire may be used.

Further alternatively, a so-called Flip Chip method of directly and electrically connecting a light receiving chip to a flexible printed circuit board for fixing the element may be used.

In the first through the third embodiments, the resin protector for protecting the light receiving element and the detection lens disposed between the objective lens actuator as condensing element driving means and the light receiving element for condensing reflection light from an information recording medium on the light receiving element is made of the cured material of a silicon resin composition containing the caged-silsesquioxane compound. It is needless to say that the cured material is usable as a material for an optical element disposed on the optical path of laser light, as required. Examples of the optical element are a diffraction grating, a collimator lens, a beam splitter, and an aberration correcting element. In most of the optical elements, the irradiation density of laser light of about 405 nm wavelength is used in several ten mW/mm$^2$ or less. Accordingly, it is easy to load the optical elements as constituent elements in an optical head. The irradiation density of laser light of about 405 nm wavelength may be applied to the aforementioned resin protector, as a design matter, depending on the arrangement of an optical head.

In the first through the third embodiments, an optical head incorporated with a laser light source for emitting light of about 405 nm wavelength is used. Alternatively, the optical element may be applied to an optical element in the optical head incorporated with a laser light source for emitting light of about 660 nm wavelength to be used in recording or reproducing information with respect to DVD; and a laser light source for emitting light of about 790 nm in wavelength to be used in recording or reproducing information with respect to CD. In an optical head incorporated with a laser light source for emitting light of about 660 nm wavelength or light of about 790 nm wavelength, and a laser light source for emitting light of about 405 nm wavelength, in the case where laser light of about 405 nm wavelength is partially reflected or cause stray lights in the optical head, and incident onto the optical element disposed on the optical path of the laser light source for emitting light of about 660 nm wavelength or light of about 790 nm wavelength, there is a drawback that the transmittance of the optical element may be lowered by deterioration of the optical element, and the quality of RF signal and servo signal from DVD or CD may be deteriorated In view of the above, use of the optical element is further advantageous in miniaturizing an optical head and simplifying the arrangement of the optical head, as compared with an arrangement of preventing partial reflection of laser light of about 405 nm wavelength or stray light.

(Fourth Embodiment)

Figure 30:
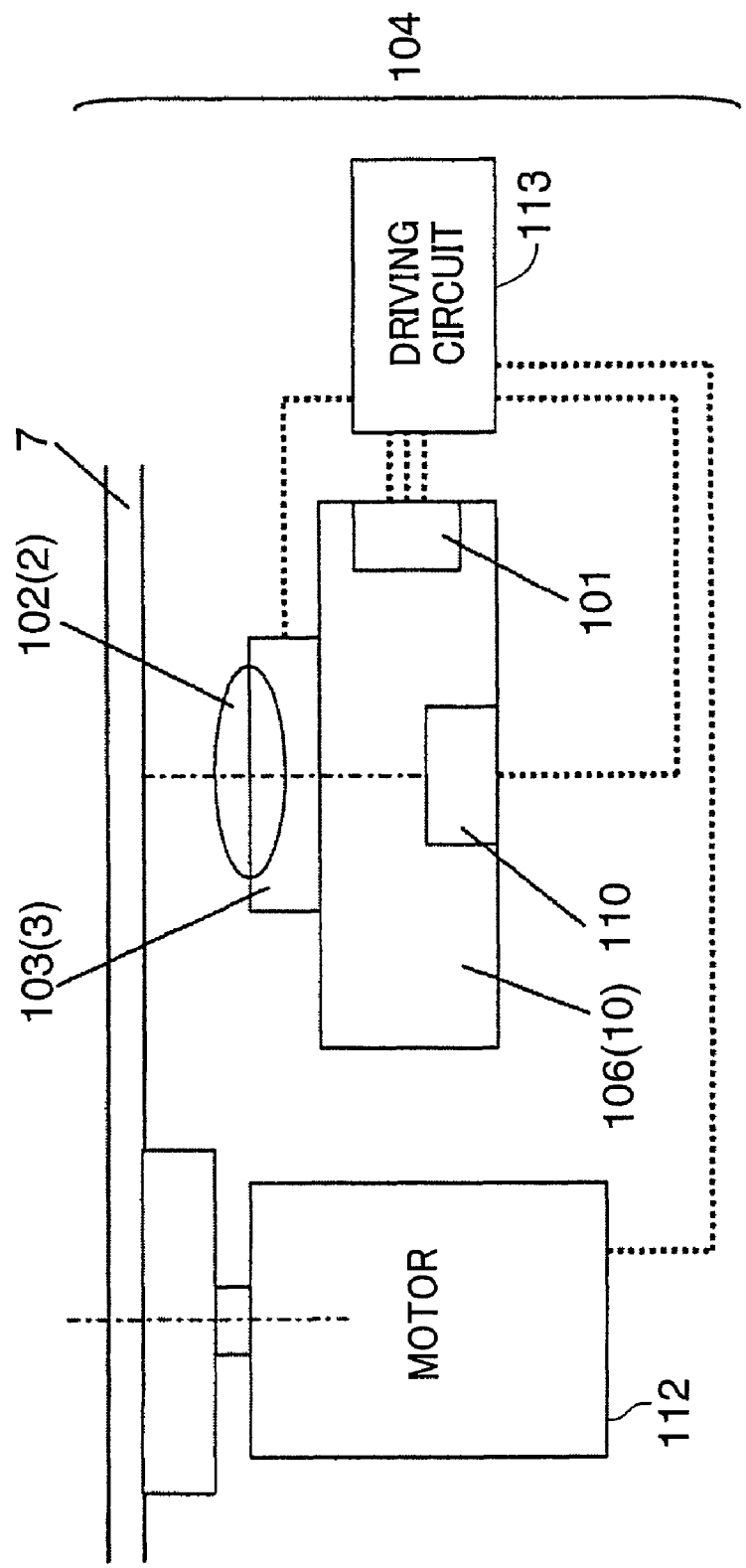
FIG. 30 is a conceptual diagram showing an arrangement of an optical information recording and reproducing device in accordance with a fourth embodiment of the invention.

In this section, an optical information recording and reproducing device 104 for recording and reproducing information with respect to an information recording medium using laser light, in accordance with the fourth embodiment of the invention, is described referring to FIG. 30.

Referring to FIG. 30, the reference numeral 7 indicates an optical disc as an information recording medium. 106 indicates an optical head. 112 indicates a motor for rotating the optical disc 7. The optical head 106 includes a light receiving element 101, a semiconductor laser light source 110 for emitting light of about 405 nm wavelength, an objective lens 102, and an objective lens actuator 103. The reference numeral 113 indicates a driving circuit for driving the optical head 106, the motor 112, and the objective lens actuator 103.

The inventive optical head as described in the first through the third embodiments e.g. the optical head 10 is used as the optical head 106 in the optical information recording and reproducing device 104.

In the optical information recording and reproducing device 104, a recorded area on the optical disc 7 from which information is to be read out is positioned as opposed to the optical head by driving the motor 112 via the driving circuit 113.

Laser light is emitted from the laser light source 110 for incidence onto the positioned recorded area of the optical disc 7. In laser light irradiation, the objective lens 102 is driven by the objective lens actuator 103 via the driving circuit 113 to condense laser light onto the recorded area. Reflection light from the recorded area is received by the light receiving element 101 constituting the optical head 106. Then, the light receiving element 101 is operable to convert the received reflection light into a signal indicating a photocurrent. Then, the motor 112, the objective lens actuator 103, and a like element are controlled based on the signal for tracking servo control with respect to the recorded area.

In the optical information recording and reproducing device 104 in accordance with the fourth embodiment, the optical head as described in the first through the third embodiments is used as the optical head 106. This enables to suppress lowering in transmittance by material deterioration of an optical element to be incorporated in an optical head. Thereby, high reliability can be secured for a long time.

(Fifth Embodiment)

Figure 31:
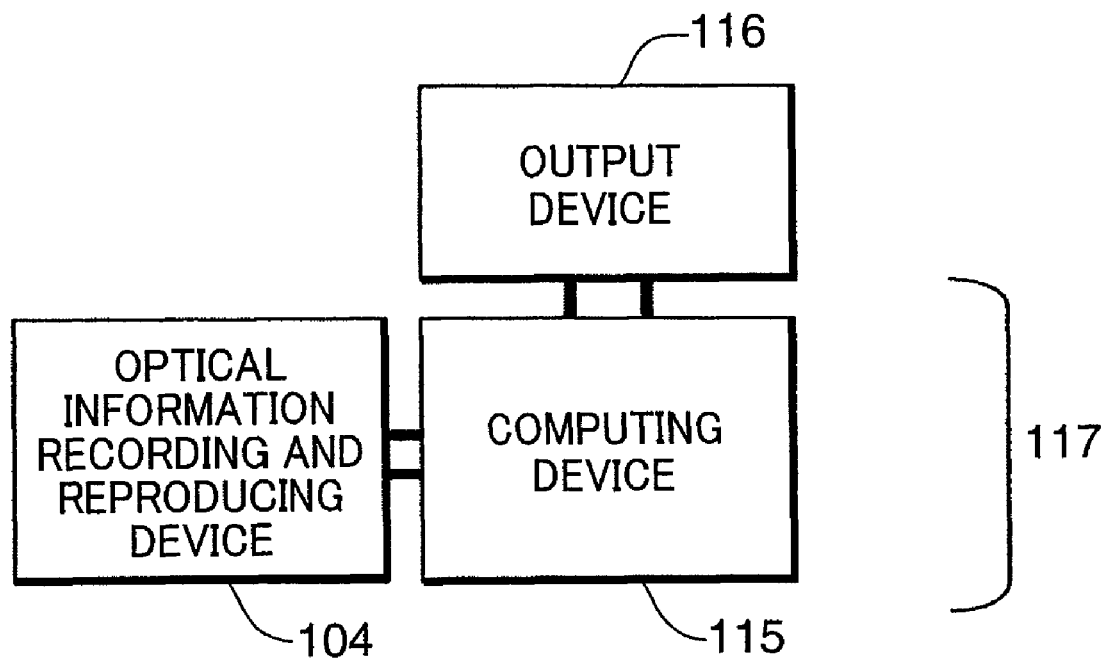
FIG. 31 is a conceptual diagram showing an arrangement of an optical information system in accordance with a fifth embodiment of the invention.
Figure 32:
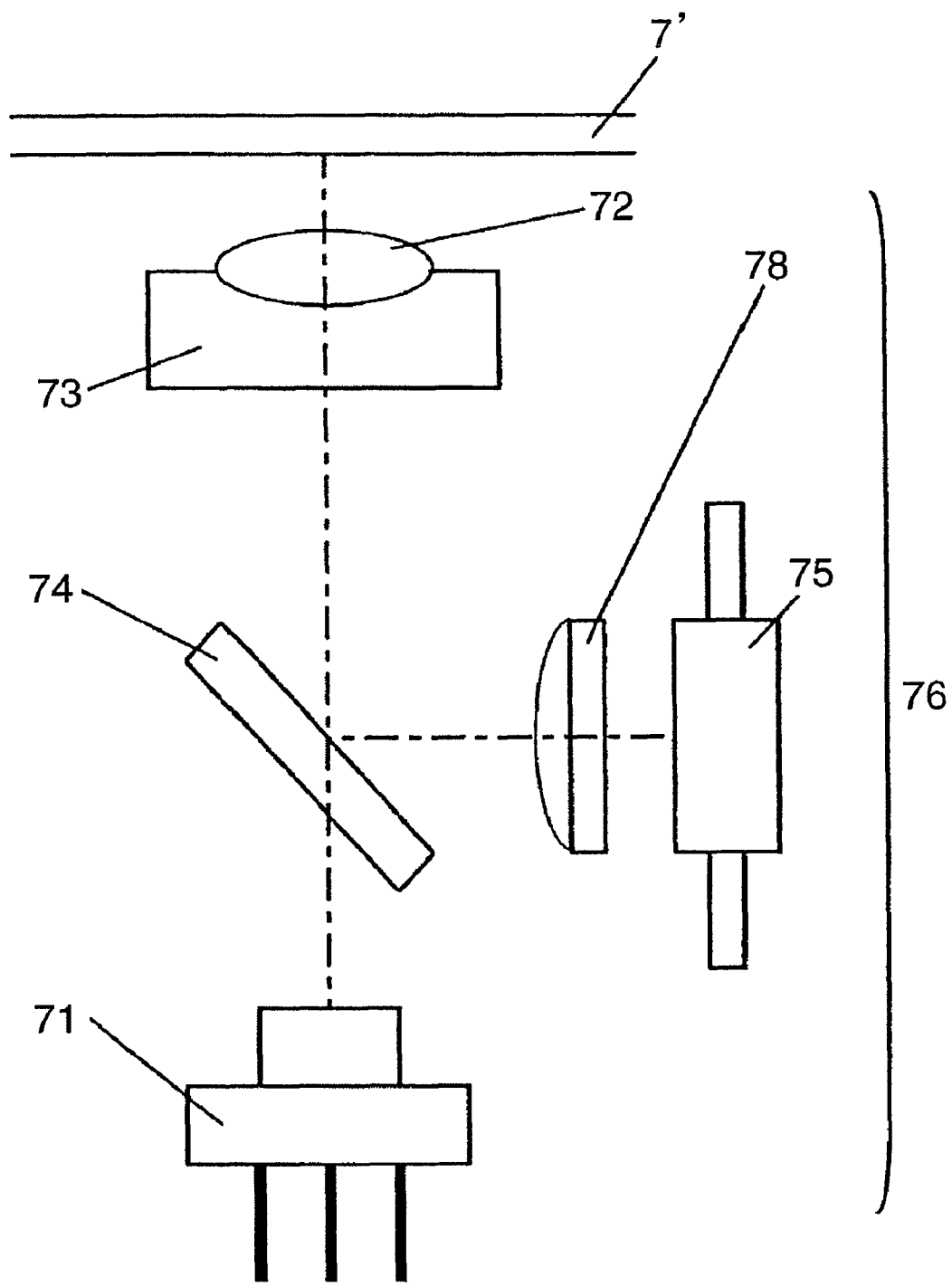
FIG. 32 is a conceptual diagram showing an arrangement of a conventional optical head.
Figure 33A:
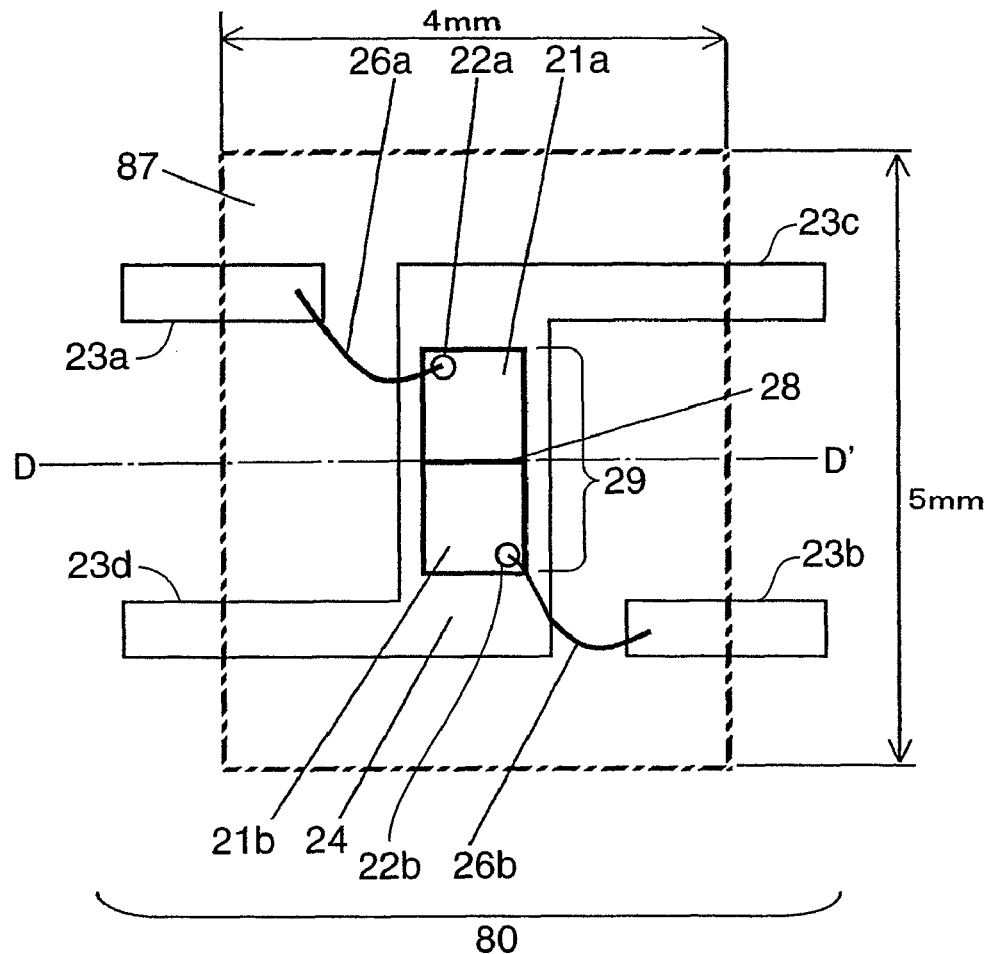
FIG. 33A is a plan view of a 2-divided photodiode of a light receiving element to be used in the conventional optical head.
Figure 33B:
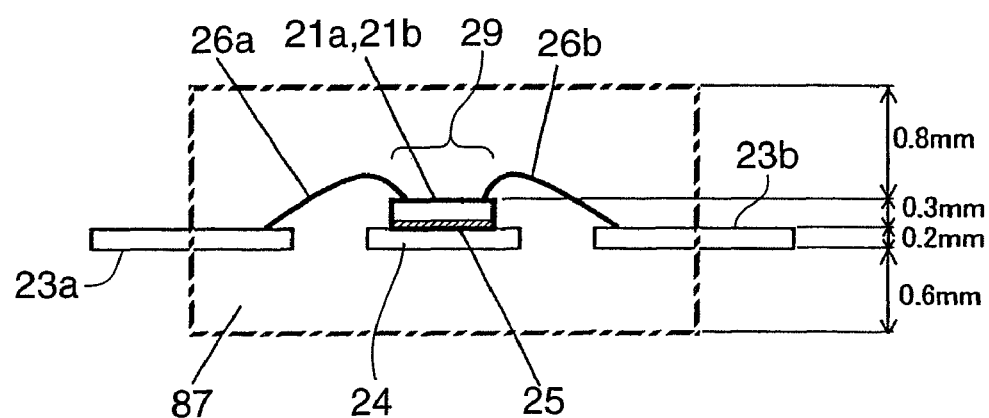
FIG. 33B is a cross-sectional view taken along the line D-D' in FIG. 33A.
Figure 34A:
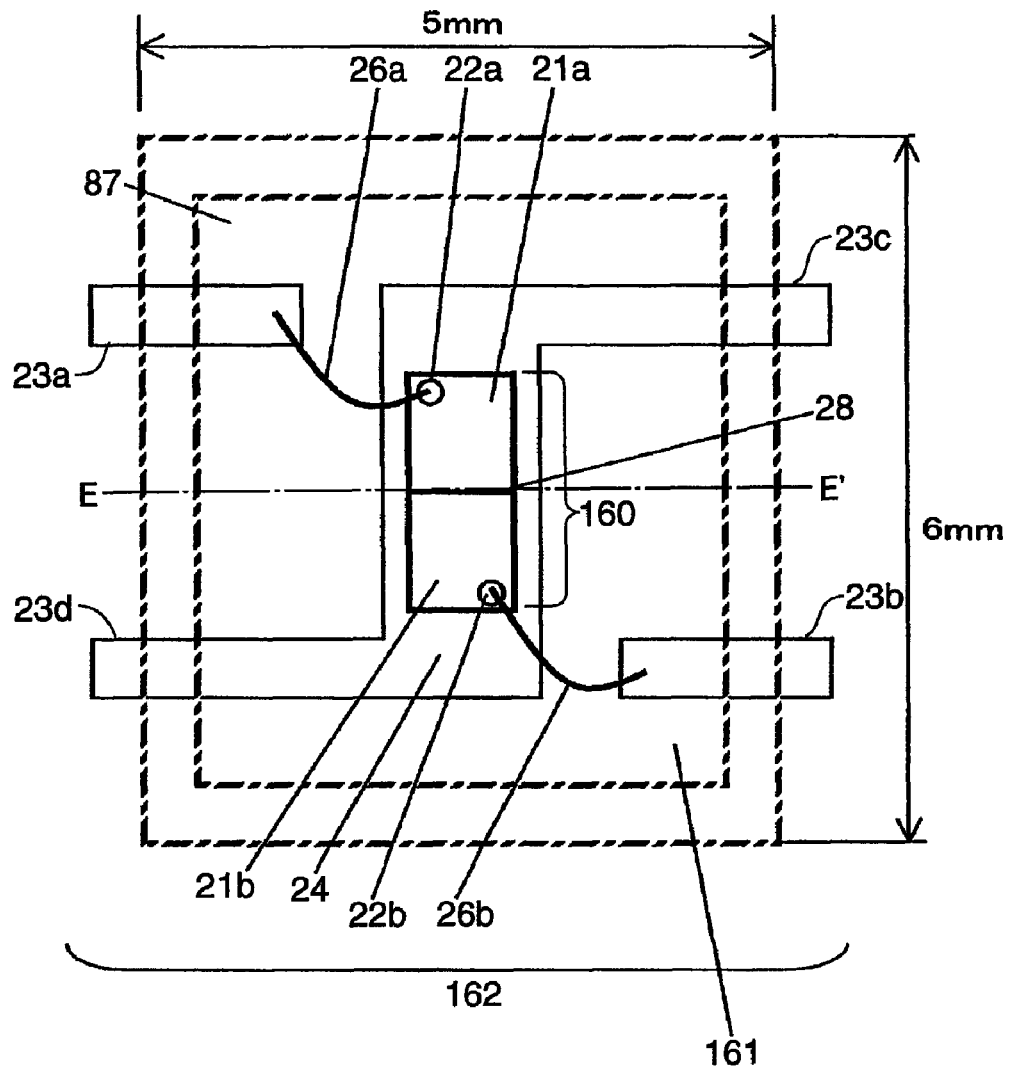
FIG. 34A is a plan view of a 2-divided photodiode of a light receiving element to be used in the conventional optical head.
Figure 34B:
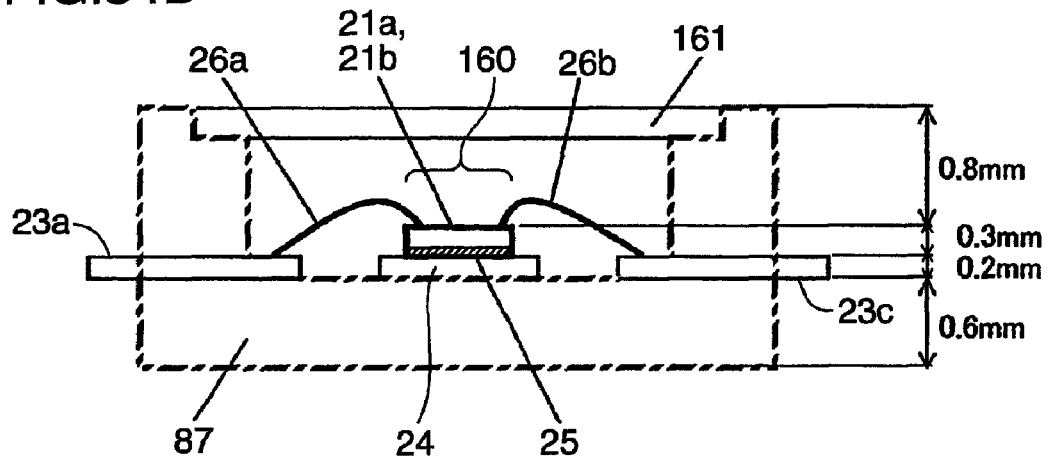
FIG. 34B is a cross-sectional view taken along the line E-E' in FIG. 34A.

In this section, an optical information system 117 in accordance with the fifth embodiment of the invention is described referring to FIG. 31.

The optical information system 117 includes the optical information recording and reproducing device 104, a computing device 115, and an output device 116.

The optical information system 117 is configured in such a manner that information read from an optical disc 7 by the optical information recording and reproducing device 104 is transmitted to the computing device 115, and the information is processed by a CPU (Central Processing Unit) incorporated in the computing device.

The processed information is transmitted to the output device 116, which, in turn, outputs the processed information as video information or audio information.

Examples of the optical information system 117 include all kinds of optical information systems for storing information, such as a computer, an optical disc player, an optical disc recorder, a car navigation system, an editing system, a data server, and an AV component.

An aspect of the invention as described above is directed to an optical head for use in an optical information recording and reproducing device for recording or reproducing information with respect to an information recording medium using laser light. The optical head includes an optical element made of a silicon resin cured material obtained by subjecting a silicon resin composition containing a silsesquioxane compound to a curing treatment. This arrangement enables to provide an optical head capable of suppressing lowering in transmittance due to material deterioration of an optical element to be used in the optical head, and maintaining a high transmittance for a long time. Also, since the optical element to be incorporated in the optical head can be fabricated by injection molding, the optical element is molded into a complicated shape. This enables to reduce the size of an optical head and simplify the arrangement of the optical head.

Preferably, the optical head may further include: an objective lens for condensing laser light to be emitted from a laser light source, and irradiating the laser light onto the information recording medium; a detection lens for condensing reflection light from the information recording medium; and a light receiving element for receiving the reflection light condensed by the detection lens, wherein the light receiving element includes a light receiving chip, and a resin protector for protecting the light receiving chip, the light receiving chip having a light receiving cell for converting the received light into a photocurrent, and an electrode connected to the light receiving cell, and at least one of the objective lens, the detection lens, and the resin protector is made of the silicon resin cured material obtained by subjecting the silicon resin composition containing the silsesquioxane compound to the curing treatment.

Preferably, the caged-silsesquioxane compound may contain at least one selected from the group consisting of silsesquioxane compounds expressed by the general formulas (1) through (3), and partially polymerized products thereof to suppress deterioration by irradiation of light having a high energy density.

$$(AR^1R^2SiOSiO_{1.5})_n(R^3R^4HSiOSiO_{1.5})_p \\ (BR^5R^6SiOSiO_{1.5})(HOSiO_{1.5})_{m-n-p-q} \quad (1)$$

$$(AR^1R^2SiOSiO_{1.5})_r(B_1R^5R^6SiOSiO_{1.5})_s \\ (HOSiO_{1.5})_{t-r-s} \quad (2)$$

$$(R^3R^4HSiOSiO_{1.5})_r(B_1R^5R^6SiOSiO_{1.5})_s \\ (HOSiO_{1.5})_{t-r-s} \quad (3)$$

where, in the formulas (1) through (3), A is a group having a carbon-carbon unsaturated bond, B is a substituted or non-substituted saturated alkyl group or hydroxyl group, $B^1$ is a substituted or non-substituted saturated alkyl group or hydroxyl group, or a hydrogen atom, $R^1$ to $R^6$ are each individually a functional group selected from a lower alkyl group, a phenyl group, and a lower arylalkyl group, m and t are each a number selected from 6, 8, 10, and 12, m is an integer from 1 to (m−1), p is an integer from 1 to (m−n), q is an integer from 0 to (m−n−p), r is an integer from 2 to t, and s is an integer from 0 to (t−r).

Preferably, the silicon resin composition may contain a crosslinking agent, particularly, a compound expressed by the general formula (4) and/or the general formula (5). A 3-dimensional crosslinked structure can be effectively formed by containing the crosslinking agent in the silicon resin composition.

$$HR^7R^8Si\text{—}X\text{—}SiHR^9R^{10} \quad (4)$$

where, in the general formula (4), X is a divalent linking group or a divalent atom, $R^7$, $R^8$, $R^9$, and $R^{10}$ are each individually an alkyl group having 1 to 3 carbons, or a hydrogen atom $$H_2C=CH\text{—}Y\text{—}CH=CH_2 \quad (5)$$

where, in the general formula (5), Y is a divalent linking group or a divalent atom.

Preferably, the silicon resin composition may contain a caged-silsesquioxane compound expressed by the general formula (2) and/or a partially polymerized product thereof, and a compound expressed by the general formula (4) to obtain a desirable curing reaction.

Preferably, the silicon resin composition may contain a caged-silsesquioxane compound expressed by the general formula (3) and/or a partially polymerized product thereof, and a compound expressed by the general formula (5) to obtain a desirable curing reaction.

Preferably, a group having a carbon-carbon unsaturated bond represented by A in the general formula (1) or the general formula (2) may be a chain hydrocarbon group having a carbon-carbon unsaturated bond at a terminal thereof to obtain excellent reactivity.

Preferably, the silsesquioxane compound may contain a caged-silsesquioxane compound expressed by the general formula (2) and/or a partially polymerized product thereof, and a caged-silsesquioxane compound expressed by the general formula (3) and/or a partially polymerized product thereof.

Preferably, the laser light to be emitted from the laser light source may be laser light of about 405 nm wavelength. Use of the inventive optical head is advantageous in preventing a likelihood that the transmittance of the optical element may be considerably lowered by continuous irradiation of laser light of about 405 nm wavelength.

Another aspect of the invention is directed to an optical information recording and reproducing device for recording or reproducing information with respect to an information recording medium using laser light, which includes the optical head having the above arrangement.

A still another aspect of the invention is directed to an optical information system device including the optical information recording and reproducing device having the above arrangement, and a computing device for performing computation based on recorded information to be reproduced from the information recording medium by the optical information recording and reproducing device.

Industrial Applicability

The inventive optical head is preferably used as an optical head incorporated with a blue laser capable of preventing lowering in transmittance of an optical element by a long-time irradiation of light having a high energy density such as blue laser light of 405 nm wavelength. Also, an optical information recording and reproducing device incorporated with the optical head 5 is usable in all kinds of optical information systems for storing information, such as a computer, an optical disc player, an optical disc recorder, a car navigation system, an editing system, a data server, and an AV component.

The invention claimed is:

1. An optical head for use in an optical information recording and reproducing device for recording or reproducing information with respect to an information recording medium using laser light, the optical head comprising:
   an objective lens for (i) condensing laser light to be emitted from a laser light source and (ii) irradiating the laser light onto the information recording medium;
   a detection lens for condensing reflection light from the information recording medium; and
   a light receiving element for receiving the reflection light condensed by the detection lens,
   wherein the light receiving element includes (i) a light receiving chip and (ii) a resin protector for protecting the light receiving chip, the light receiving chip having (i) a light receiving cell for converting the received light into a photocurrent and (ii) an electrode connected to the light receiving cell,
   wherein the objective lens, the detection lens, and the resin protector are made of a silicon resin cured material obtained by subjecting a silicon resin composition containing a caged-silsesquioxane compound to a curing treatment, and
   wherein the caged-silsesquioxane compound contains at least one kind selected from the group consisting of silsesquioxane compounds expressed by the general formulas (1) through (3), and partially polymerized products thereof:

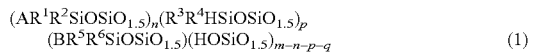
(1)

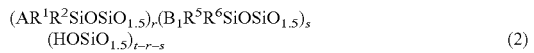
(2)

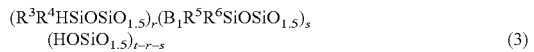
(3)

where, in the formulas (1) through (3), A is a group having a carbon-carbon unsaturated bond, B is a substituted or non-substituted saturated alkyl group or hydroxyl group, $B^1$ is a substituted or non-substituted saturated alkyl group or hydroxyl group, or a hydrogen atom, $R^1$ to $R^6$ are each individually a functional group selected from a lower alkyl group, a phenyl group, and a lower arylalkyl group, m and t are each a number selected from 6, 8, 10, and 12, n is an integer from 1 to (m−1), p is an integer from 1 to (m−n), q is an integer from 0 to (m−n−p), r is an integer from 2 to t, and s is an integer from 0 to (t−r).

2. The optical head according to claim 1,
   wherein the silicon resin composition contains a crosslinking agent capable of crosslinking the caged-structured silsesquioxane compound.

3. The optical head according to claim 2,
   wherein the crosslinking agent is a compound expressed by the general formula (4) and/or the general formula (5)

(4)

where, in the general formula (4), X is a divalent linking group or a divalent atom, $R^7$, $R^8$, $R^9$, and $R^{10}$ are each individually an alkyl group having 1 to 3 carbons, or a hydrogen atom

(5)

where, in the general formula (5), Y is a divalent linking group or a divalent atom.

4. The optical head according to claim 3,
   wherein the silicon resin composition contains the silsesquioxane compound expressed by the general formula (2) and/or the partially polymerized product thereof, and the crosslinkable monomer expressed by the general formula (4).

5. The optical head according to claim 3,
   wherein the silicon resin composition contains the caged-silsesquioxane compound expressed by the general formula (3) and/or the partially polymerized product thereof, and the crosslinkable monomer expressed by the general formula (5).

6. The optical head according to claim 1,
   wherein the group having the carbon-carbon unsaturated bond represented by A in the general formula (1) or the general formula (2) is a chain hydrocarbon group having a carbon-carbon unsaturated bond at a terminal thereof.

7. The optical head according to claim 1,
   wherein the caged-silsesquioxane compound contains the silsesquioxane compound expressed by the general formula (2) and/or the partially polymerized product thereof, and the silsesquioxane compound expressed by the general formula (3) and/or the partially polymerized product thereof.

8. The optical head according to claim 1, wherein the laser light to be emitted from the laser light source is laser light of about 405 nm wavelength.

9. An optical information recording and reproducing device for recording or reproducing information with respect to an information recording medium using laser light, comprising the optical head of claim 1.

10. An optical information system device comprising:
    the optical information recording and reproducing device of claim 9; and
    a computing device for performing computation based on recorded information to be reproduced from the information recording medium by the optical information recording and reproducing device.

* * * * *